(12) United States Patent
Davis

(10) Patent No.: US 7,443,691 B1
(45) Date of Patent: Oct. 28, 2008

(54) INTERIOR AND EXTERIOR SHELL CONTAINING A PRINTED CIRCUIT BOARD WITH EXTENDING CONNECTOR

(76) Inventor: Steven M. Davis, 2610 Arbor Vall, Cumming, GA (US) 30041

( * ) Notice: Subject to any disclaimer, the term of this patent is extended or adjusted under 35 U.S.C. 154(b) by 0 days.

(21) Appl. No.: 11/852,217

(22) Filed: Sep. 7, 2007

(51) Int. Cl.
*H05K 5/00* (2006.01)
(52) U.S. Cl. ..................................... 361/752; 361/797
(58) Field of Classification Search ................ 361/757, 361/800, 790, 797, 760, 720, 736; 312/223
See application file for complete search history.

(56) References Cited

U.S. PATENT DOCUMENTS

| | | | |
|---|---|---|---|
| 6,522,534 B1 * | 2/2003 | Wu | 361/686 |
| 6,618,243 B1 * | 9/2003 | Tirosh | 361/683 |
| 6,976,925 B2 * | 12/2005 | Owens et al. | 473/372 |
| 7,259,967 B2 | 8/2007 | Ni | |
| 7,364,445 B1 * | 4/2008 | Ni et al. | 439/140 |
| 2005/0122419 A1 * | 6/2005 | Yoon | 348/360 |

* cited by examiner

*Primary Examiner*—Hung S Bui

(57) ABSTRACT

The apparatus forms a shell (a) composed of an exterior shell (1000) and an interior shell (2000). The interior shell (1000) contains a circuit, a Printed Circuit Board with a standard interface, such as an USB connector, extending from the interior shell (1000). An exterior shell groove (1300) accepts the interior shell (1000) into the exterior shell (1000) with the interior shell (2000) secured within the exterior shell groove (1300) by detent and friction interaction. An imprint surface (1001) is formed to receive exterior shell texture (1005) and interior shell texture (2005) including dimples forming a golf ball appearance and logos.

5 Claims, 21 Drawing Sheets

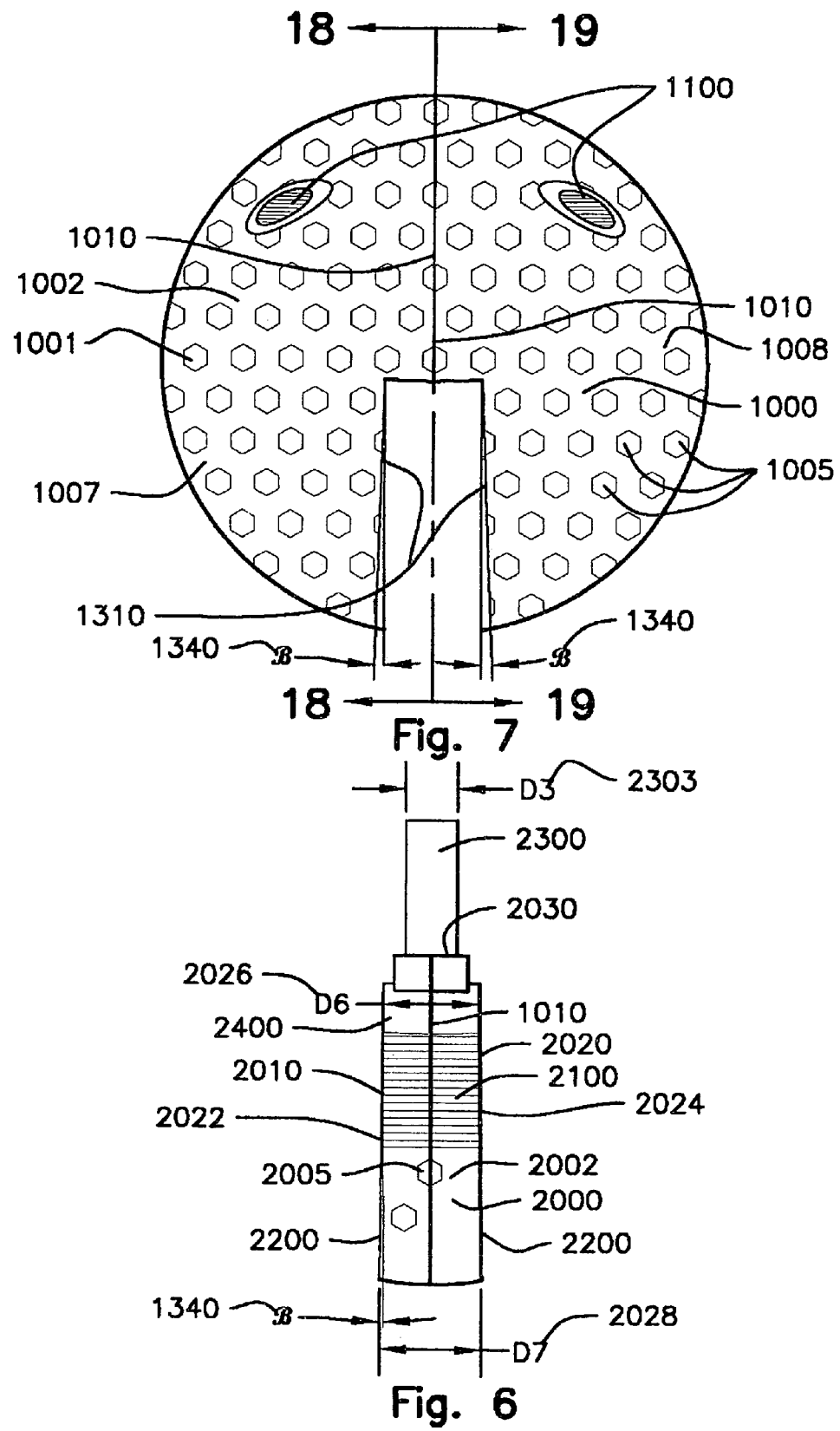

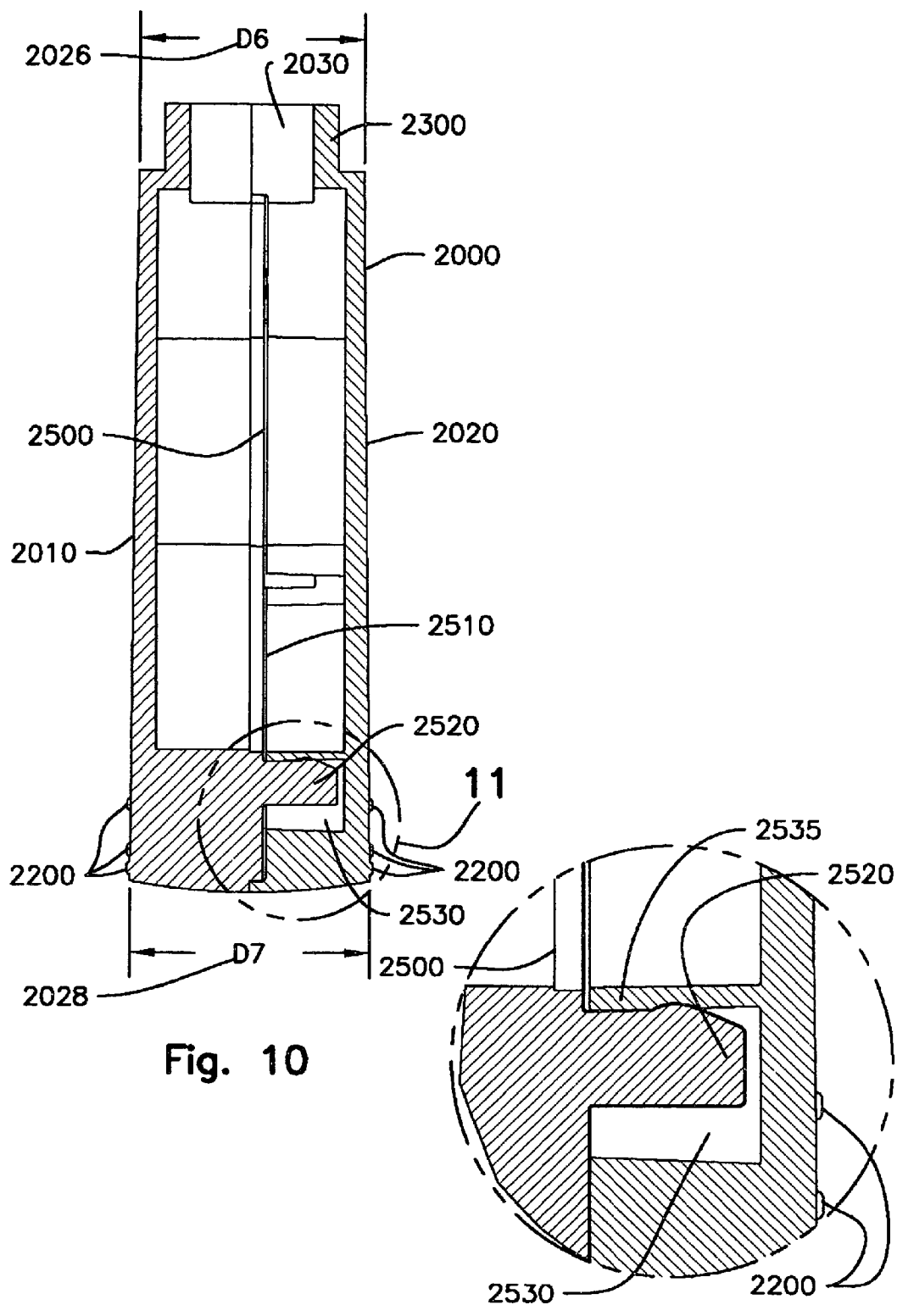

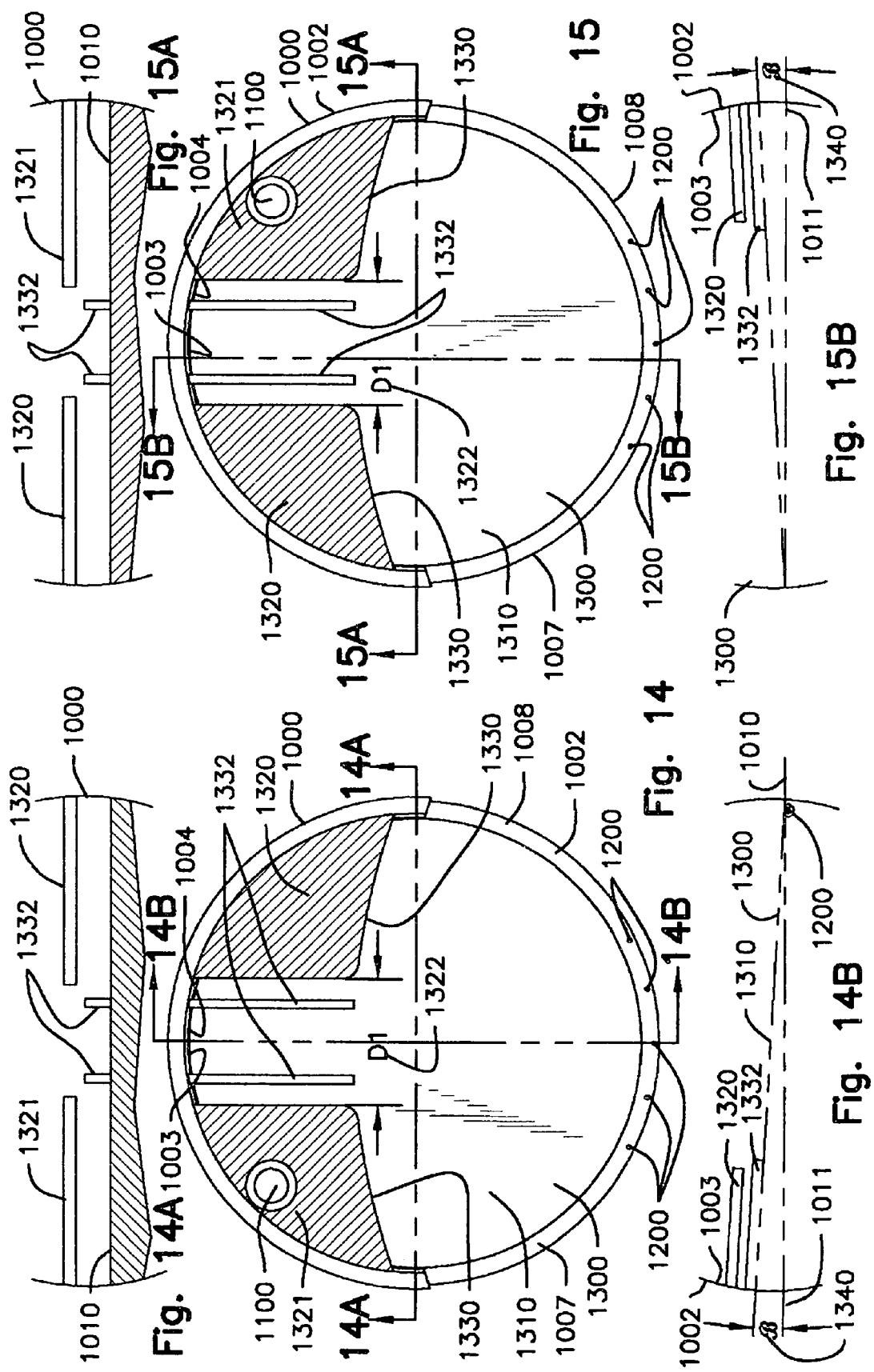

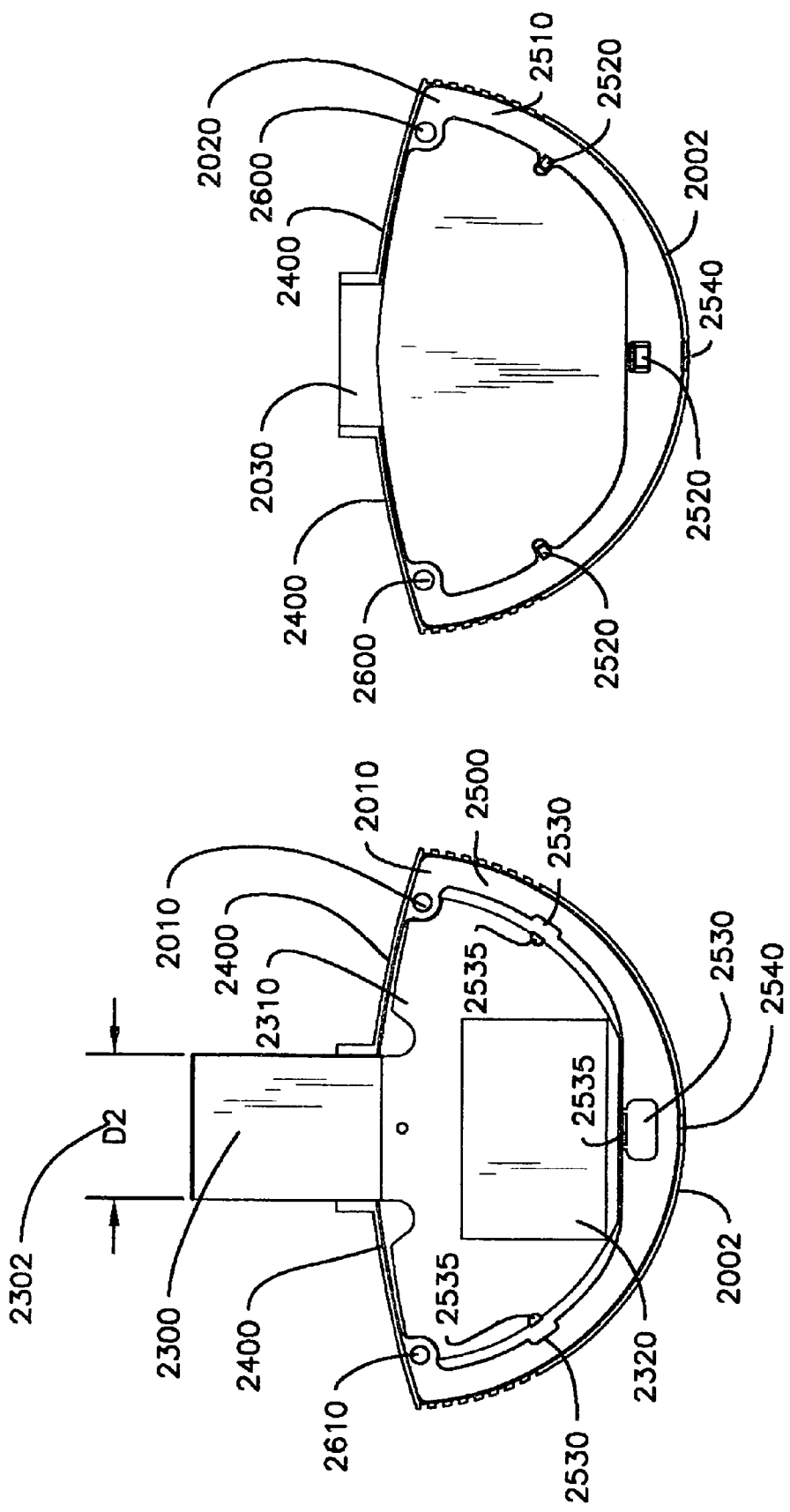

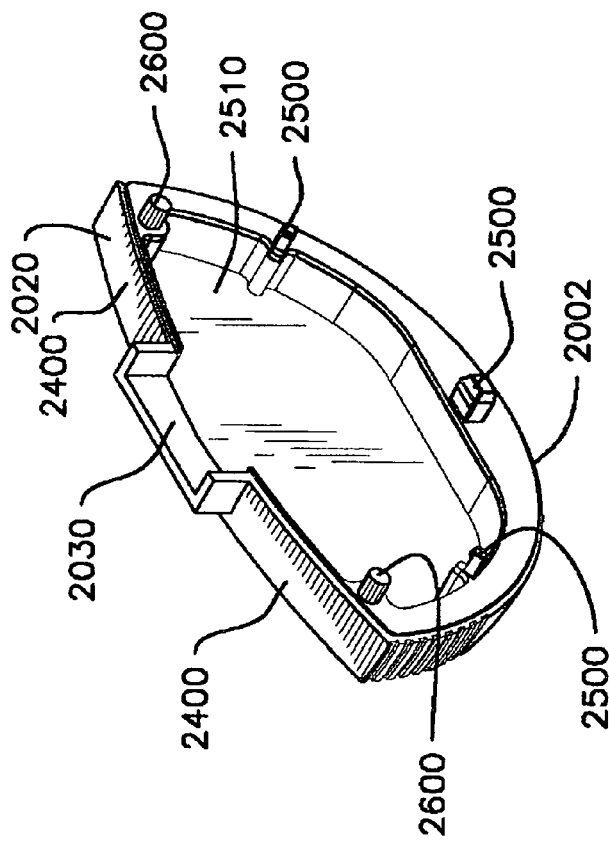
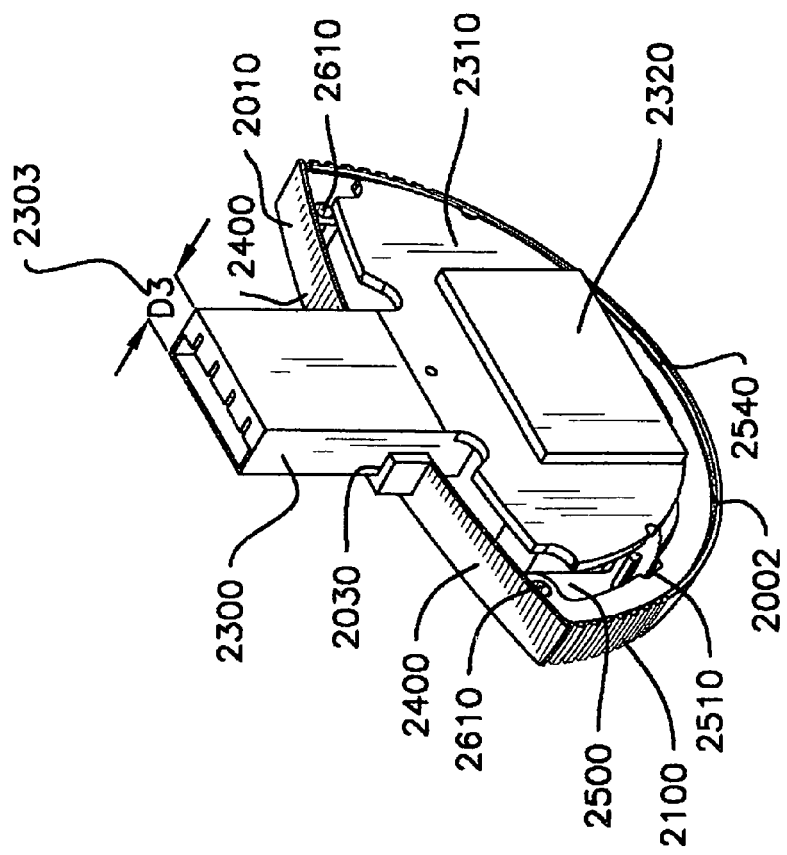
Fig. 19
Fig. 18

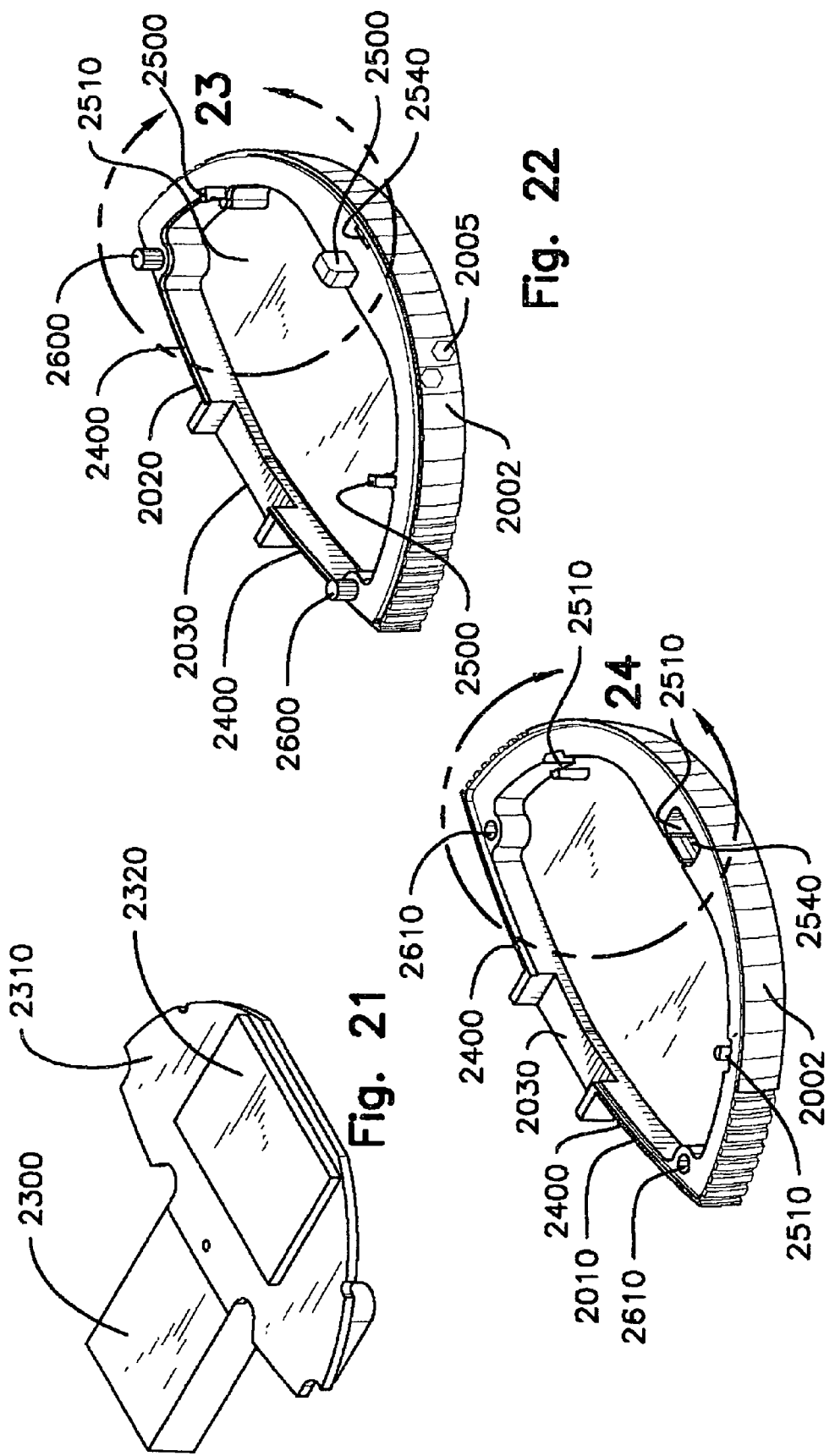

INTERIOR AND EXTERIOR SHELL CONTAINING A PRINTED CIRCUIT BOARD WITH EXTENDING CONNECTOR

FIELD OF THE INVENTION

This invention relates to an apparatus which forms an interior and exterior shell, enclosure or housing structure containing a Printed Circuit Board with a extended connector. More specifically this structure pertains to an interior shell containing a PCB with a standard interface, such as a USB connector, extending from the interior shell and where the interior shell is securely contained in an exterior shell for safe transport of the PCB and interface.

BACKGROUND OF THE INVENTION

Printed Circuit Boards (PCB) with a connecting interface fulfill applications in addition to data storage where mobility or portability of the PCB is desired. The connecting interface may be a standard interface such as, but not limited to, a USB connector.

Shells, enclosures or housings for portable PCB are known including U.S. Pat. No. 7,259,967 to Ni.

SUMMARY OF THE INVENTION

The apparatus (1) comprises an exterior shell (1000) having a exterior shell groove (1300) which receives an interior shell (2000) housing a Printed Circuit Board, a circuit and a standard interface including a USB connector. The exterior shell groove (1000) has an exterior shell groove surface (1310) at an acute angle to a vertical which exerts a friction engagement with the interior shell (2000) when inserted into the exterior shell groove (1000). Exterior shell detents (1200) are aligned with interior shell detents (2200) for additional security in retaining the interior shell (2000) within the exterior shell groove (1000). The interior shell (2000) presents an acute angle in accordance with that formed at the interior shell groove surface (1310).

BRIEF DESCRIPTION OF THE DRAWINGS

The foregoing and other features and advantages of the present invention will become more readily appreciated as the same become better understood by reference to the following detailed description of the preferred embodiment of the invention when taken in conjunction with the accompanying drawings, wherein:

FIG. 6 is a side elevation of the interior shell (2000) interior shell surface (2002), interior shell texture (2005), interior shell first side (2010), interior shell second side (2020), interior shell first interior side (2022), interior shell second interior side (2024), interior shell first interior side width D6 (2026), interior shell second interior side width D7 (2028), interior shell interface aperture (2030), finger grip (2100), interior shell detent (2200), interface (2300), interface depth D3 (2303) and interface guide mating surface (2400).

FIG. 7 is a plan view of the exterior shell (1000) showing the imprint surface (1001), exterior shell surface (1002), exterior shell texture (1005), exterior shell right half (1007), exterior shell left half (1008), shell circumference (1010), key chain aperture (1100), exterior shell groove (1300) and exterior shell groove surface (1310).

FIGS. 10 and 11 show section 10 from FIG. 9 with detail 11 from FIG. 10 illustrating the interior shell interface aperture (2030), interior shell first inside (2500), interior shell second inside (2510), interior shell spring detent (2520), interior shell spring detent recess (2530), interior shell spring detent spring (2535).

FIGS. 14, 14A, 14B, 15, 15A and 15B illustrates the exterior shell interior surface (1003), exterior shell groove back (1004), key chain aperture (1100), exterior shell detent (1200), exterior shell groove (1300), exterior shell groove back (1004), exterior shell groove surface (1310), first shell groove interface guide (1320), second shell groove interface guide (1321), interface guide width D1 (1322), groove interface guide mating surface (1330), shell groove interface support (1332) and exterior shell groove surface angle (1340).

FIGS. 16 through 22 illustrates the interior shell (2000) showing the interior shell surface (2002), interior shell texture (2005), interior shell first side (2010), interior shell second side (2020), interior shell interface aperture (2030), finger grip (2100), interface (2300), interface width D2 (2302), interface depth D3 (2303), circuit board (2310), circuit (2320), interface guide mating surface (2400), interior shell first inside (2500), interior shell second inside (2510), interior shell spring detent (2520), interior shell spring detent recess (2530), interior shell spring detent spring (2535), detent release slot (2540), interior shell alignment post (2600) and interior shell alignment aperture (2610). Additionally, FIG. 20 presents detail 24 and FIG. 22 presents detail 23.

FIGS. 25 through 31 illustrates a shell (1) in a shape configuration differing from that illustrated in FIG. 1 showing features, in addition to those described in FIGS. 1-5, including shell radius transition (1006), shell side (1009) and exterior shell plane (1011).

FIGS. 32 and 33 illustrates shell (1) shape configurations differing from those of FIGS. 1-5 and FIG. 25-31.

DETAILED DESCRIPTION

Figure 1:
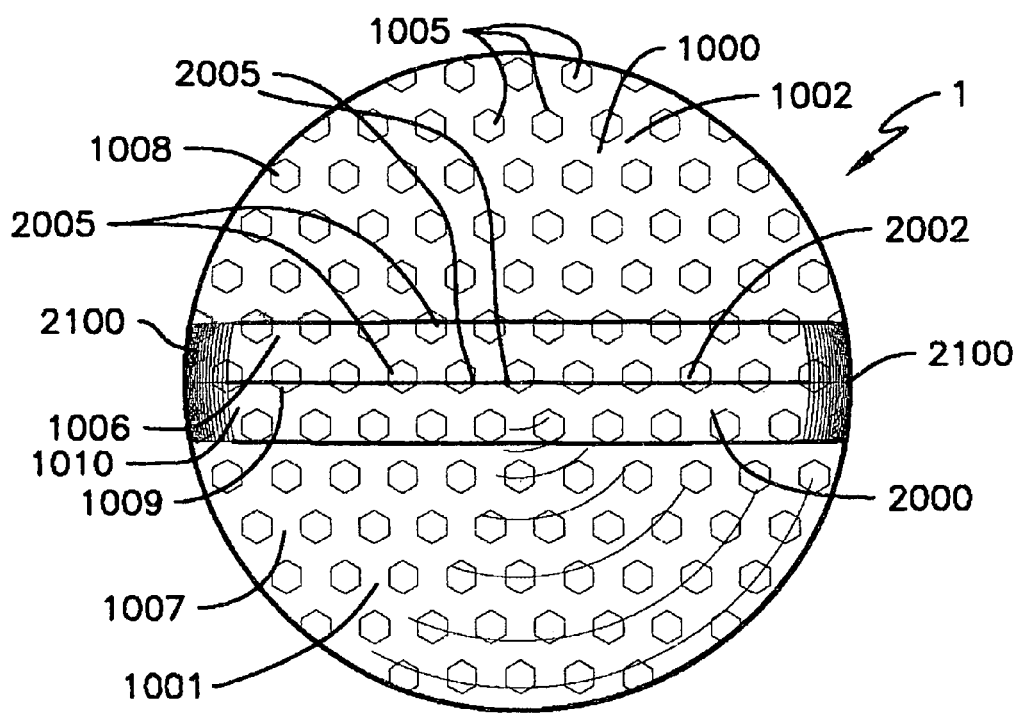
FIGS. 1-5, 25, 26, 28, 32 and 33 illustrates the apparatus (1) showing the external shell (1000) having an imprint surface (1001), an exterior shell surface (1002), an exterior shell texture (1005), exterior shell right half (1007) and exterior shell left half (1008). Also illustrated is a shell circumference (1010), exterior shell plane (1011), key chain aperture (1100). Seen as well is an interior shell (2000), an interior shell surface (2002), interior shell texture (2005) and finger grip (2100). As appreciated from the Drawings, the interior shell surface (2002), while it may have an interior shell texture (2005), is intentionally limited in its encroachment on the imprint surface (1001) thereby allowing maximum surface area for imprinting of logos and other texture features. Structures depicted in FIGS. 25, 26, 23 and 33 illustrate the configuration where the interior shell (2000) and the interior shell surface (2002) do not encroach on the imprint surface (1001). The imprint surface (1001) has an imprint surface major diameter (1013) and an imprint surface minor diameter (1015) determining the area of the imprint surface (1001). The imprint surface (1001) is maximized by minimizing the area of the shell radius transition (1006) and shell side (1009).
Figure 2:
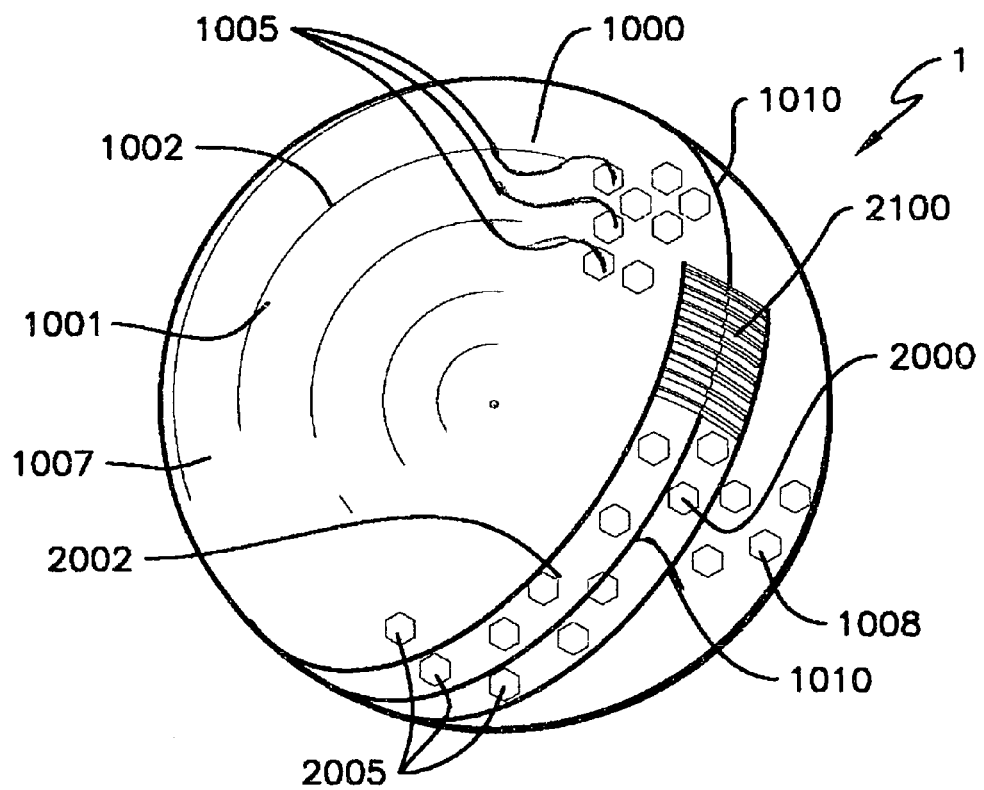

Seen in FIGS. 1-5, 25, 26, 28, 32 and 33 is the interior and exterior shell containing a printed circuit board with extending connector apparatus (1) presented in this invention which composes a shell (1) having an exterior shell (1000) with an imprint surface (1001), an exterior shell surface (1002) and an interior shell (2000) with an interior shell surface (2002). A shell radius transition (1006) from the imprint surface (1001) to the exterior shell surface (1002) and to the interior shell surface (2002) forms a rounded surface between the imprint surface (1001) and shell sides (1009).

Also seen in FIGS. 1-5, 25, 26, 28, 32 and 33 is that the exterior shell surface (1002) has an exterior shell texture (1005) and the interior shell (2000) has an interior shell texture (2002). The exterior shell texture (1005) and the interior shell texture (2002) may be smooth, dimpled and circular, elliptical or polygon shaped depressions or ridges. The exterior shell texture (1005) and the interior shell texture (2002) may give the invention an appearance of a golf ball. The exterior shell texture (1005) and the interior shell texture (2002), where dimpled or having a pattern, will overlap between exterior shell (1000) and the interior shell (2000) thus obscuring the existence of the interior shell (2000) when received into the exterior shell (1000).

Again, seen in FIGS. 1-5, 25, 26, 28, 32 and 33, is that the shell (1) has a shell circumference (1010) with a shell plane (1011) extending through the shell circumference (1010) dividing the exterior shell (1000) into two generally mirror image halves and dividing the interior shell (2000) into two generally mirror image halves. The shell (1) may be generally spheroid, hexahedron or cuboid in shape and may have cross-sections which are circular, elliptical, oval, square and rectangular in cross-section. Where the shell (1) is generally spherical, it may be formed into two generally mirror image hemispheres. The shell (1), where other than spheroidal in shape will have shell sides (1009) which are joined with the imprint surface (1001) by a shell radius (1006). The shell radius (1006), between the imprint surface (1001) and the shell sides (1009), forms a curvature or curved transition between the imprint surface (1001) and the shell sides (1009).

FIGS. 7, 7A, 7B, 8, 14, 14A, 14B, 15, 15A, 15B, 30 and 31 show that the exterior shell (1000) has an exterior shell groove (1300) bisected by the shell plane (1011). The exterior shell (1000) forms an exterior shell right half (1007) and an exterior shell left half (1008). The exterior shell groove (1300) extends into the exterior shell (1000) and away from the exterior shell surface (1002). The exterior shell groove (1300) is equidistant from the exterior shell right half (1007) and the exterior shell left half (1008).

FIGS. 7, 7A, 7B, 8, 14, 14A, 14B, 15, 15A, 15B, 30 and 31 also shows that the exterior shell groove (1300) at the exterior shell right half (1007) and at the exterior shell left half (1008) has an exterior shell groove surface (1310). The exterior shell groove surface (1310) is planar. The exterior shell (1000), the exterior shell groove (1300), the exterior shell groove surface will generally be formed by a molding process comprised of generally rigid and semi-rigid materials including plastics, metals, composite materials and carbon fiber materials.

As seen in FIGS. 7A, 7B, 14, 14A, 14B, 15, 15A and 15B, there is at least one first shell groove interface guide (1320) within the exterior shell groove (1300) which is immovably affixed by first shell groove interface guide (1320) affixing means to and extending outwardly from an exterior shell interior surface (1003), at an exterior shell groove back (1004), toward the exterior shell surface (1002) and coincident with the exterior shell plane (1011). Also, seen is at least one second groove interface guide (1321) within the exterior shell groove (1300) immovably affixed by second groove interface guide (1321) affixing means to and extending outwardly from an exterior shell interior surface (1003), at the exterior shell groove back (1004), toward the exterior shell surface (1002) and coincident with the exterior shell plane (1011). The at least one first shell groove interface guide (1320) and the at least one second shell groove interface guide (1321) are generally orthogonal to the exterior shell plane (1011) and are planar.

Also seen in FIGS. 7A, 7B, 14, 14A, 14B, 15, 15A and 15B is that the at least one first shell groove interface guide (1320) is distal from the at least one second shell groove interface guide (1321). The at least one first shell groove interface guide (1320) is separated from the at least one second shell groove interface guide (1321) by interface guide width D1 (1322). There is a groove interface guide mating surface (1330) is at each of the at least one first shell groove interface guide (1320) and the at least one second shell groove interface guide (1321) distal to the exterior shell groove back (1004).

Again in FIGS. 7A, 7B, 14, 14A, 14B, 15, 15A and 15B it is seen that there is at least one shell groove interface support (1332) extending outwardly from the exterior shell right half (1007) exterior shell groove surface (1310) toward the exterior shell left half (1008) and orthogonal to the exterior shell plane (1011). There is at least one shell groove interface support (1332) extending outwardly from the exterior shell left half (1008) exterior shell groove surface (1310) toward the exterior shell right half (1007) and orthogonal to the exterior shell plane (1011). Each of the at least one shell groove interface support (1332) at the exterior shell right half (1007) exterior shell groove surface (1310) and at the exterior shell left half (1008) exterior shell groove surface (1310) extends from or proximal to the exterior shell interior surface (1003) at the exterior shell groove back (1004) away from the exterior shell interior surface (1003) and the exterior shell groove back (1004). In the preferred embodiment there are at least two shell groove interface supports (1332) at the exterior shell right half (1007) exterior shell groove surface (1310) and at the exterior shell left half (1008) exterior shell groove surface (1310).

FIGS. 7A, 7B, 14, 14A, 14B, 15, 15A and 15B most clearly show that the at least one shell groove interface support (1332) extends outwardly from the exterior shell right half (1007) exterior shell groove surface (1310) separated by a shell groove interface support separation D5 (1335) from the at least one shell groove interface support (1332) extending outwardly from the exterior shell left half (1008) exterior shell groove surface (1310).

FIGS. 14B and 15B show that the exterior shell groove surface (1310) is at an exterior shell groove surface angle β (1340) to the exterior shell plane (1011). The exterior shell groove surface angle β (1340) is in the range of 0° and 5° and, in the preferred embodiment, is 0.5°. The vertex of angle β (1340) is at or proximal to the exterior shell interior surface (1003) at the exterior shell groove back (1004).

Figure 3:
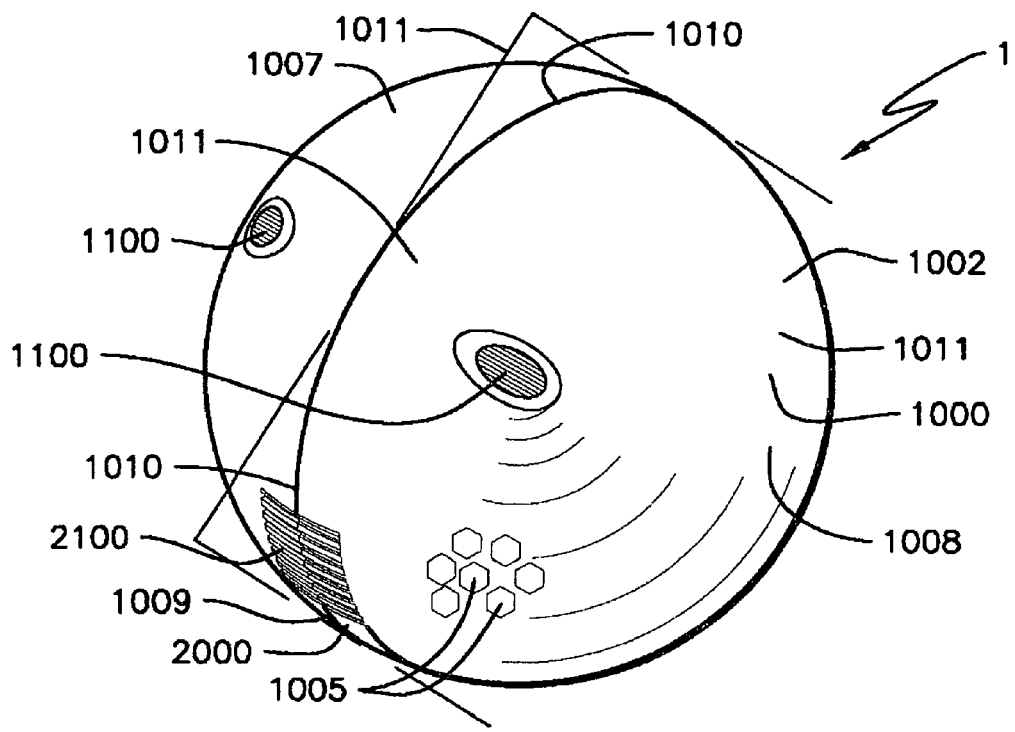
Figure 4:
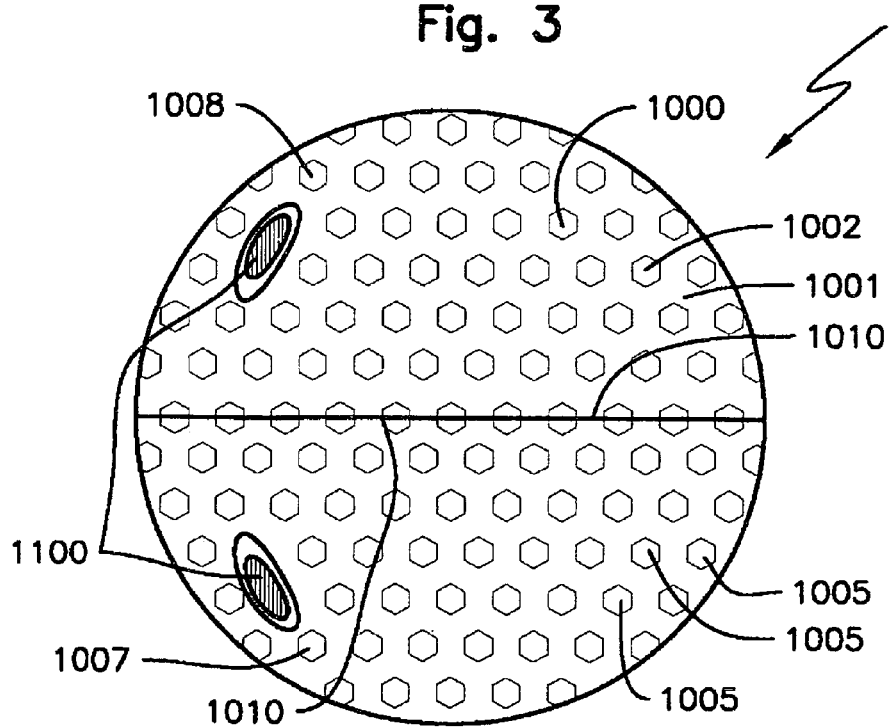
Figure 5:
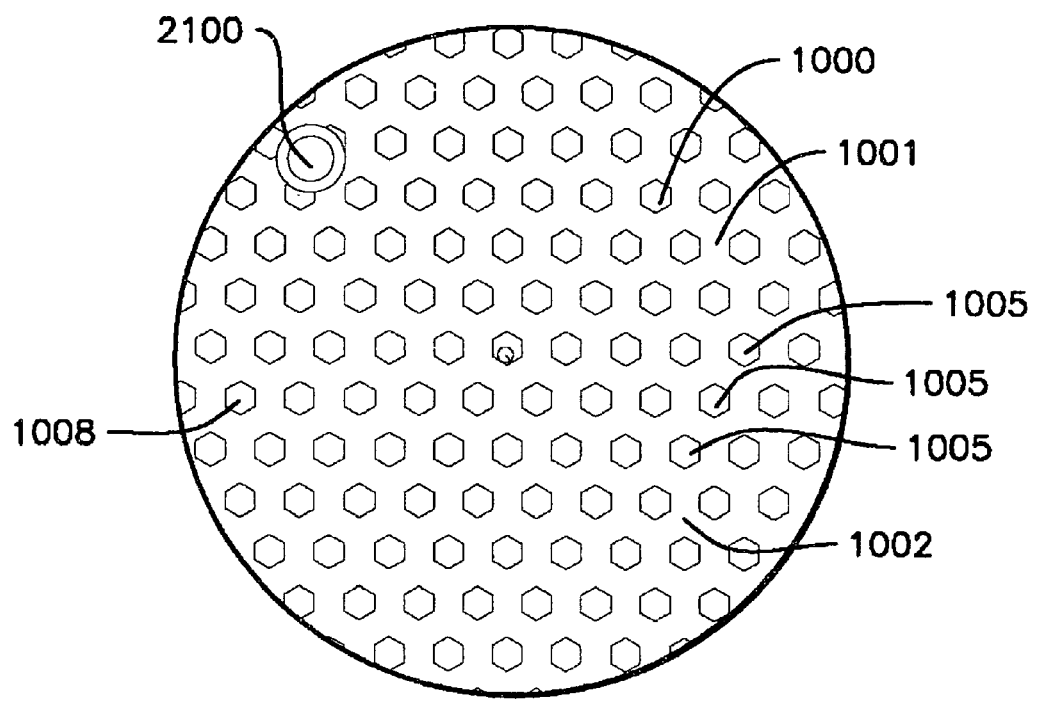
Figure 5A:
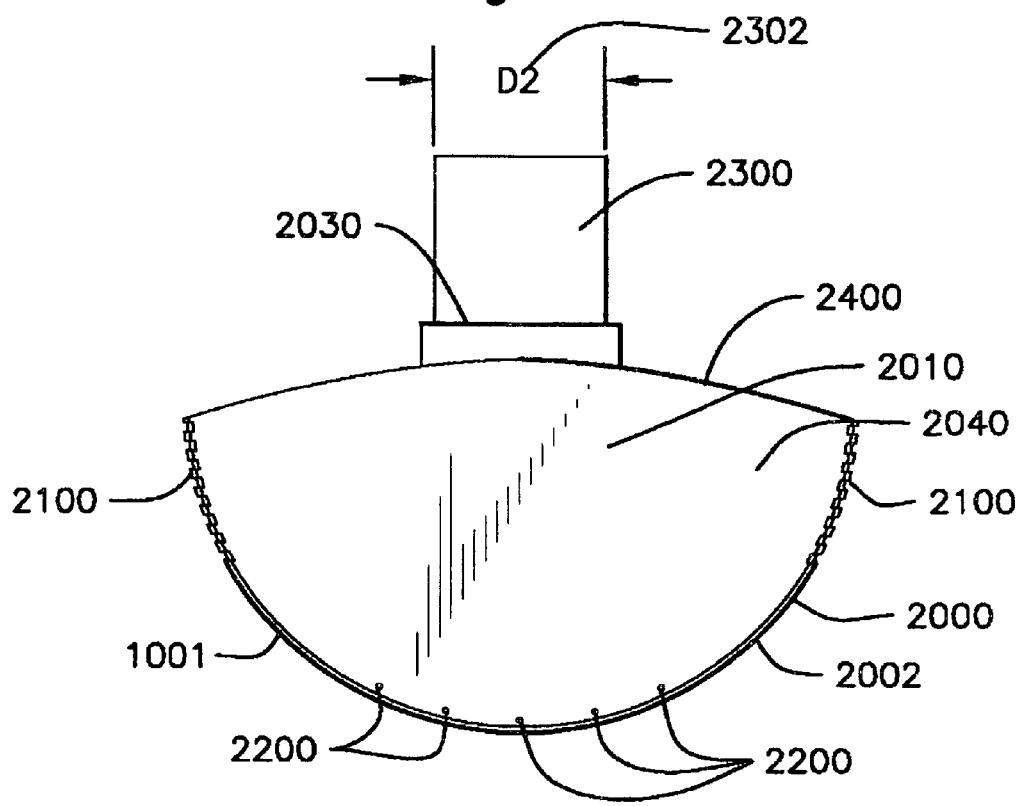
FIG. 5A is a plan view of the interior shell (2000) showing the interior shell surface (2002), interior shell first side (2010), interior shell first interior side (2022), interior shell second interior side (2024), finger grip (2100), interior shell detent (2200), interface (2300), interior shell interface aperture (2030), interior shell detent (2200), interface width D2 (2302) and interface guide mating surface (2400).
Figure 7A:
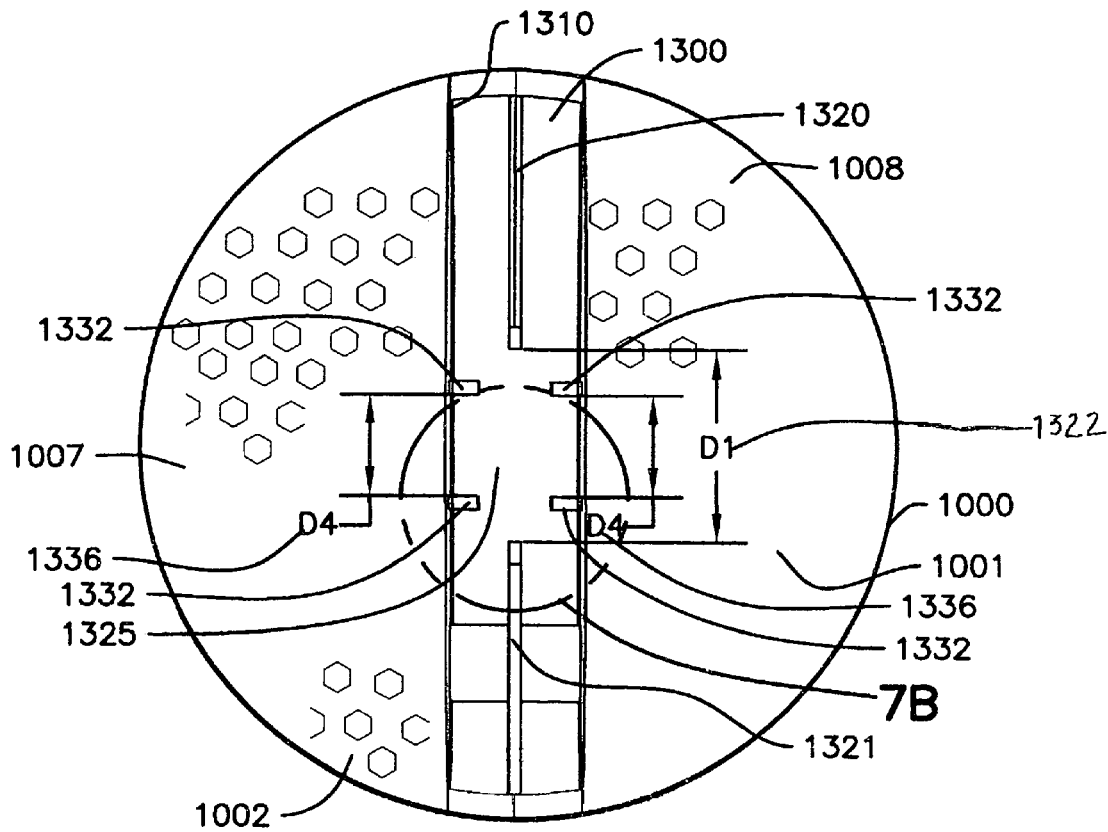
FIGS. 7A and 7B illustrate features in addition to those seen in FIG. 7 including exterior shell groove surface (1310), first shell groove interface guide (1320) and second shell groove interface guide (1321).
Figure 7B:
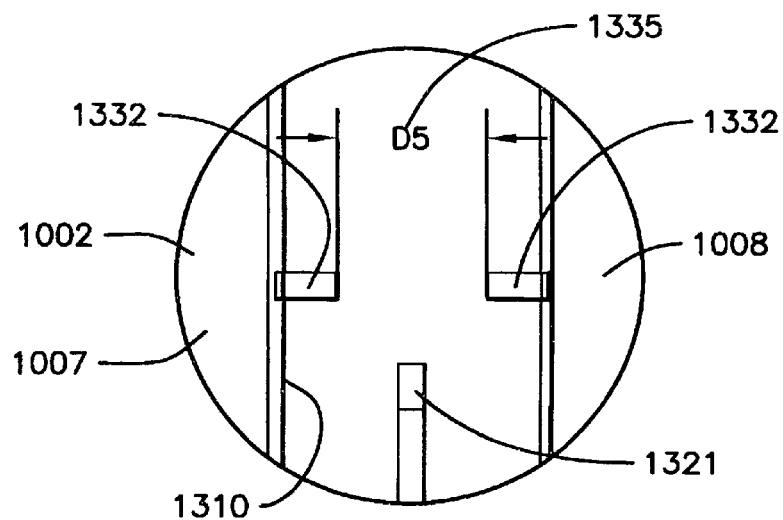
Figure 8:
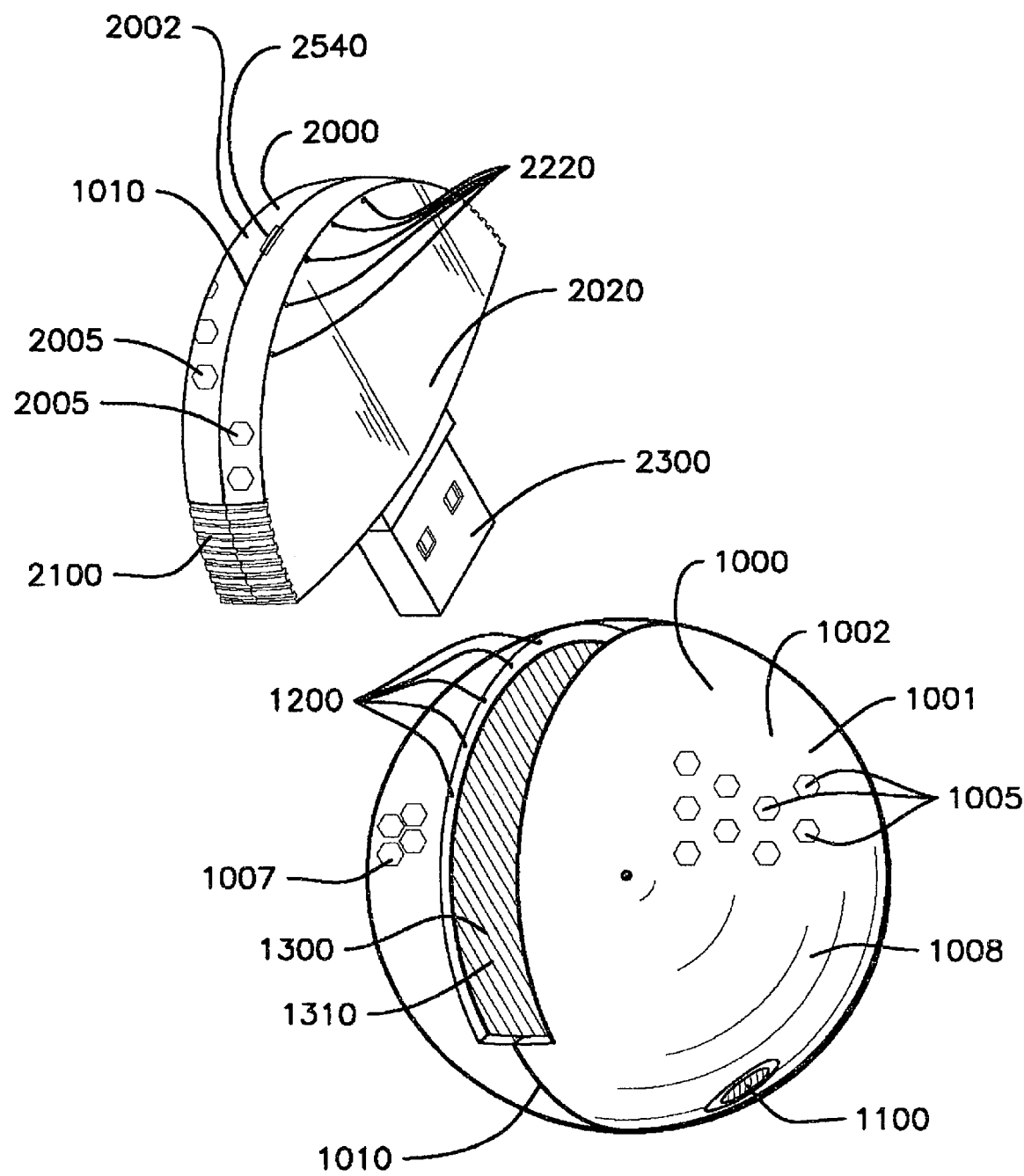
FIG. 8, shows features in addition to those seen in FIGS. 1-7 including exterior shell detent (1200), exterior shell groove surface (1310) and interior shell second side (2020).
Figure 9:
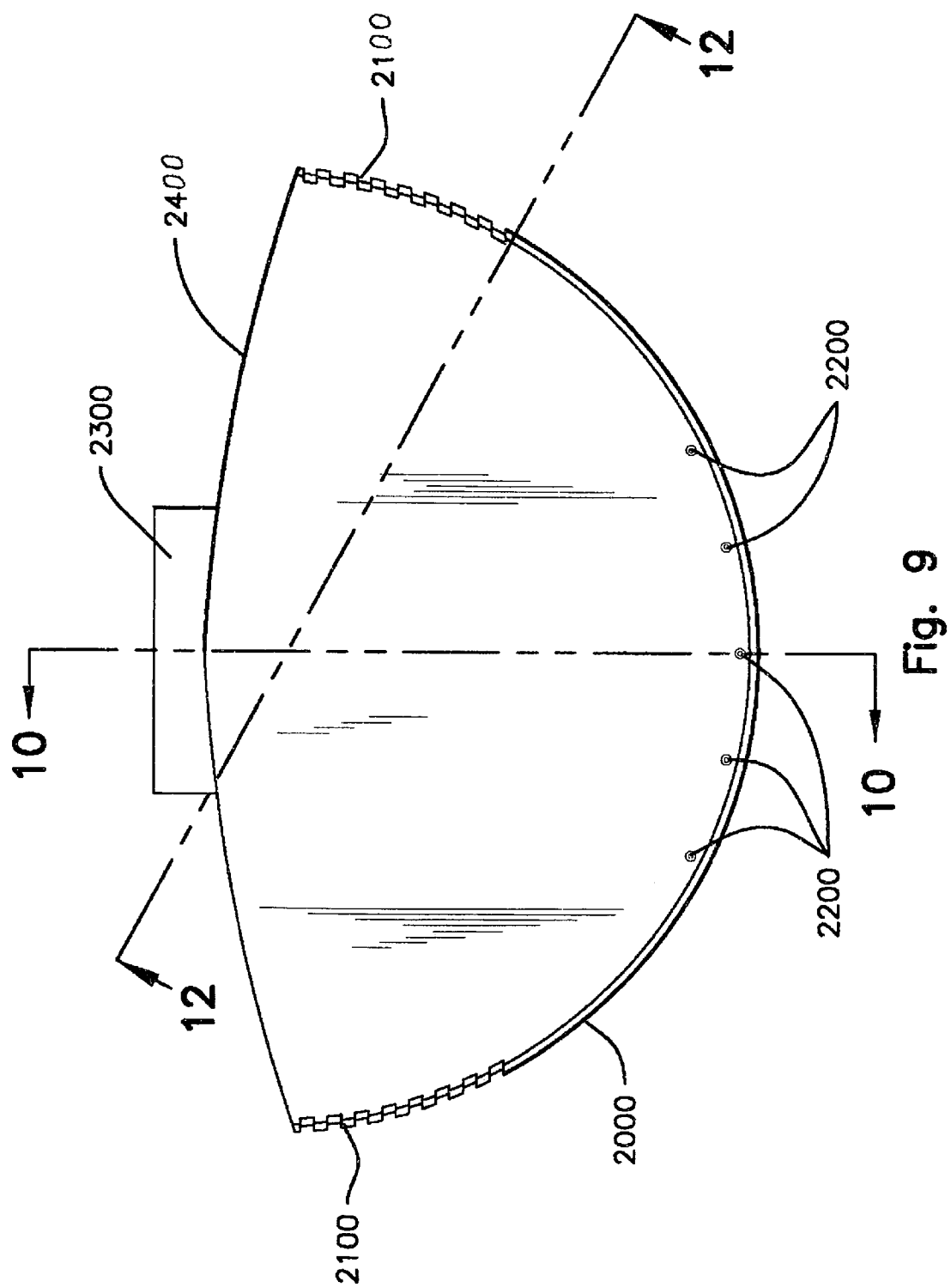
FIG. 9 illustrates a plan view of the interior shell (2000) presenting sections 10 and 12 in addition to features otherwise previously noted.
Figures 12, 13:
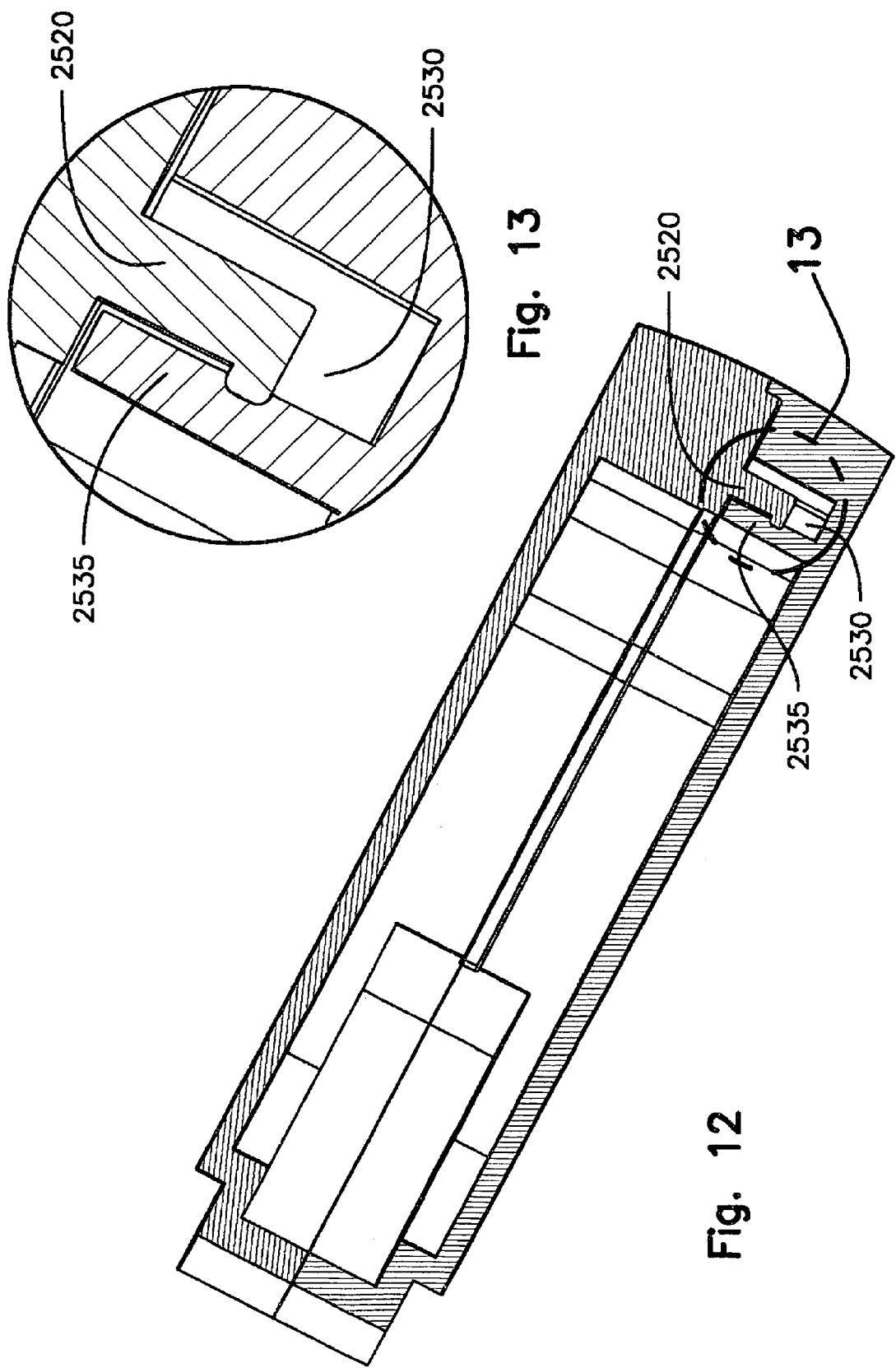
FIGS. 12 and 13 illustrate section 12 from FIG. 9 and detail 13 from FIG. 12 showing interior shell spring detent (2520), interior shell spring detent recess (2530) and interior shell spring detent spring (2535).

FIG. 3, 4, 5, 7, 8, 14, 15, 25, 26, 28, 30, 31, illustrates that a key chain aperture (1100) is formed from the exterior shell right half (1007) to the exterior shell left half (1008) to receive a lanyard or key chain.

FIGS. 8, 14, 15, 30, 31, 32 and 33 shows that at least one exterior shell detent (1200) is within the exterior shell groove (1300) at the exterior shell groove surface (1310) at the exterior shell right half (1007). The at least one exterior shell detent (1200) is proximal the exterior shell surface (1002) and the at least one exterior shell detent (1200) is either an indentation or a protrusion.

FIG. 5A, 6, 8, 9, 10, 29, 32, 33 shows that the interior shell (2000) has an interior shell surface (2002) having an interior shell texture (2005), an interior shell first side (2010), an interior shell second side (2020) and an interior shell interface aperture (2030). The interior shell interface aperture (2030) sized to securely receive an interface (2300).

FIGS. 5A, 8, 9, 10, 27, 29, 31, 32 and 33 shows that at least one interior shell detent (2200) which is an indentation if the at least one exterior shell detent (1200) is a protrusion and which is a protrusion if the at least one exterior shell detent (1200) is an indentation. The at least one interior shell detent (2200) is aligned with and detent mates with the at least one exterior shell detent (1200) to create detent securing means when the interior shell (2000) is received into the exterior shell groove (1300).

FIGS. 5A, 6, 8, 16, 18, 21, 27, 29, 31, 32 and 33 illustrates that the interface (2300) is a standard Printed Circuit Board and cable connection means including an USB connector. The interface (2300) has an interface width D2 (2302) and an interface depth D3 (2303). The interface (2300) is connected by electronic circuit connection means, including wiring, with a circuit board (2310) having at least one circuit (2320).

FIGS. 5A, 8, 9, 14, 14A, 14B, 15, 15A, 15B, 16-22, 27, 29, 32 and 33 shows that the interior shell (2000) has an interface guide mating surface (2400) which mirrors the shape of the groove interface guide mating surface (1330). The interface guide mating surface (2400) and the groove interface guide mating surface (1330) are in close proximity or touch when the interior shell (2000) is received into the exterior shell groove (1300).

FIGS. 5A, 6, 8, 9 and 10 shows that the interior shell (2000) has an interior shell first interior side (2022) and an interior shell second interior side (2024). When the interior shell (2000) is received into the exterior shell groove (1300) the interior shell first interior side (2022) and the interior shell second interior side (2024) will be proximal to the exterior shell groove surface (1310) to one of either the exterior shell right half (1007) or the exterior shell left half (1008). An interior shell first interior side width D6 (2026), from the interior shell first interior side (2022) to the interior shell second interior side (2024) and proximal the interface (2300), is less than an interior shell second interior side width D7 (2028) from the interior shell first interior side (2022) to the interior shell second interior side (2024) and distal to the interface (2300). The interior shell first interior side (2022) and the interior shell second interior side (2024) are at an exterior shell groove surface angle β (1340) to the exterior shell plane (1011) when the interior shell (2000) is received into the exterior shell groove (1300). The exterior shell groove surface angle β (1340) of the interior shell first interior side (2022) and the interior shell second interior side (2024) dictated by the exterior shell groove surface angle β (1340) of the angle between the exterior shell groove surface (1310) and the exterior shell plane (1011). The function of the exterior shell groove surface angle β (1340) is to provide a friction engagement of the interior shell (2000) with the exterior shell groove surface (1310) as the interior shell (2000) is received and detent secured within the exterior shell groove (1300). the vertex of angle β (1340), at the interior shell (2000), is at or proximal to the interface (2300). The exterior shell groove surface angle β (1340) at the interior shell (2000) is equal to the exterior shell groove surface angle β (1340) at the exterior groove surface (1310).

FIGS. 16-24 shows that the interior shell first side (2010) has an interior shell first inside (2500). The interior shell second side (2020) has an interior shell second inside (2510). The interior shell first interior side (2010) is secured to the interior shell second side (2020) by at least one upstanding interior shell spring detent (2520), in either the interior shell first inside (2500) or the interior shell second inside (2510), and is received into at least one interior shell spring detent recess (2530) which is in the opposing either interior shell first interior inside (2500) or the interior shell second inside (2510), having an upstanding interior shell spring detent spring (2535). The interior shell spring detent (2520) exerts a protrusion or an indentation against the interior shell spring detent spring (2535) which, by spring bias of the interior shell spring detent spring (2535) and detent interaction, thereby securely affixes the interior shell first interior side (2010) to the interior shell second interior side (2020).

FIG. 16-18, 20, 22, 24-26, 31-33 shows that the at least one upstanding interior shell spring detent (2520) is released from the at least one interior shell spring detent recess (2530) by a twisting action asserted at a detent release slot (2540). The detent release slot (2540) is between the interior shell first inside (2500) and the interior shell second inside (2510) at and proximal the shell circumference (1010) at the interior shell (2000).

Figure 23:
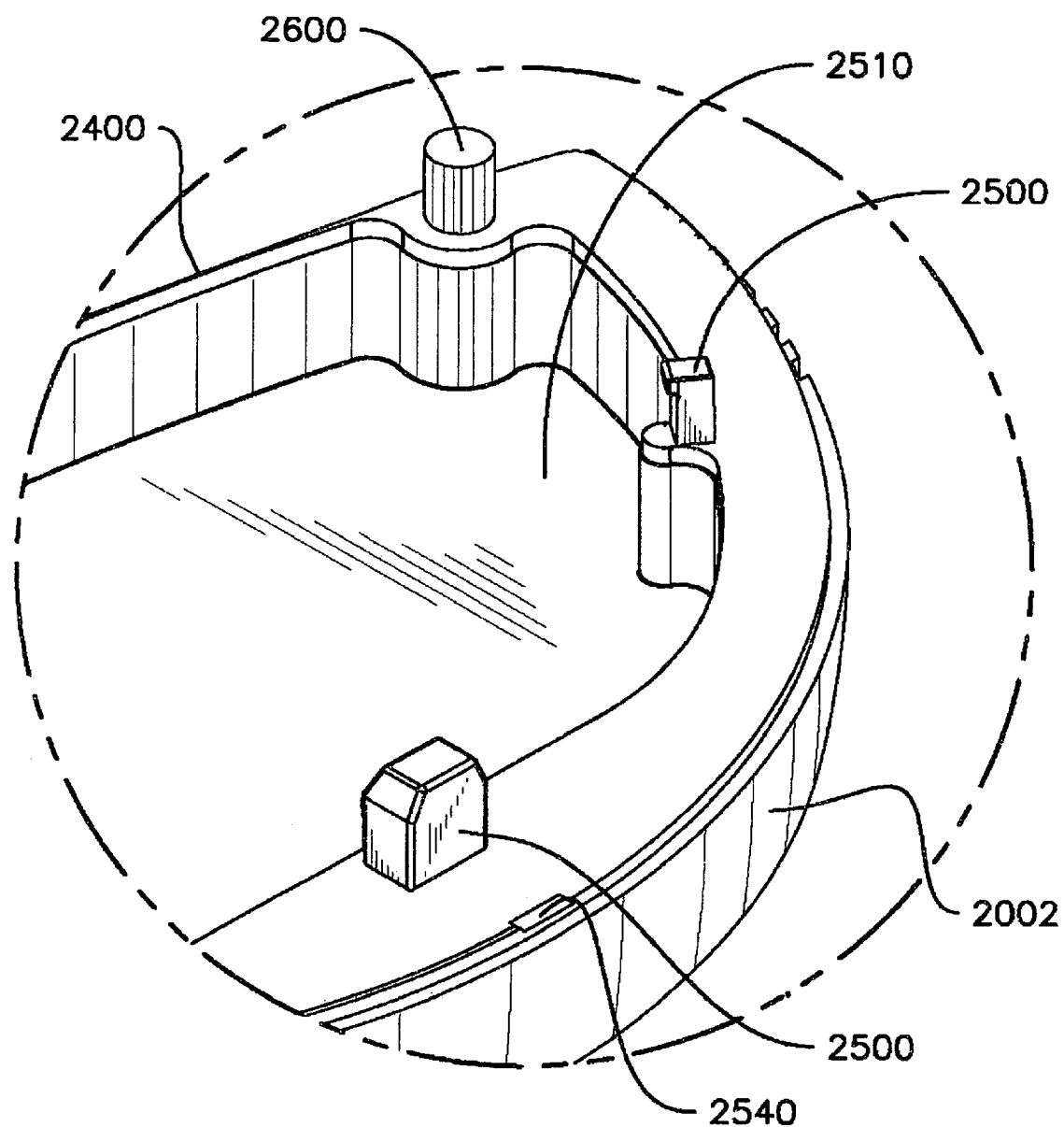
FIGS. 23 and 24 shows the interior shell first inside (2500), interior shell second inside (2510), interior shell spring detent (2520), interior shell spring detent recess (2530), interior shell spring detent spring (2535), detent release slot (2540), interior shell alignment post (2600) and interior shell alignment aperture (2610).
Figure 24:
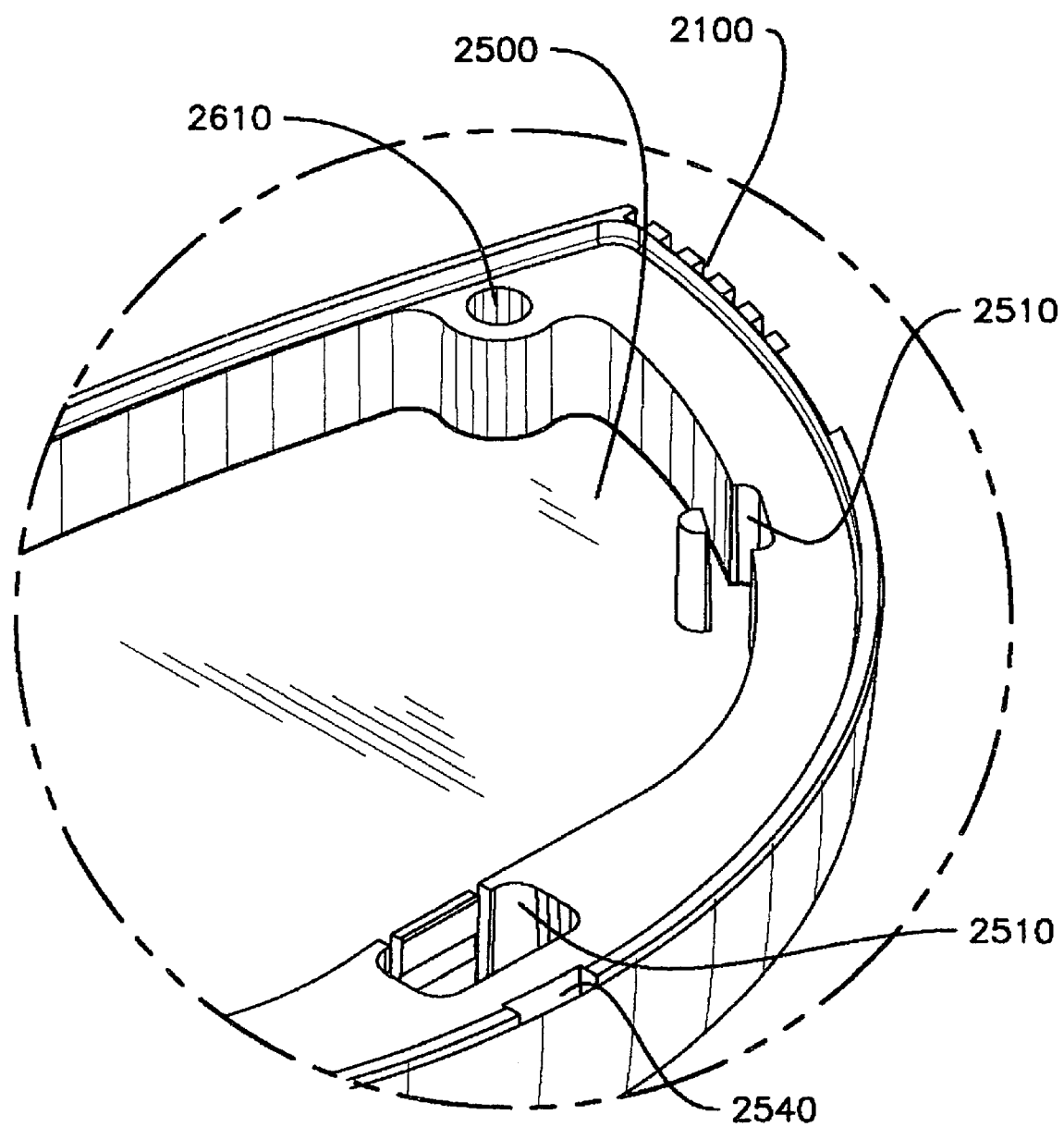
Figure 26:
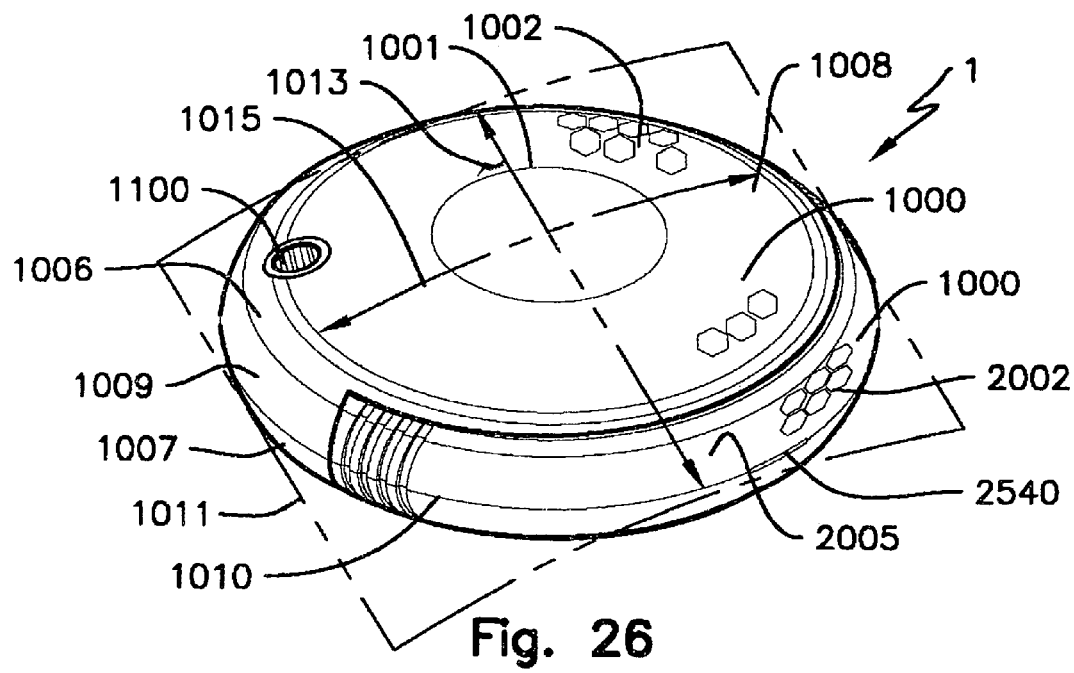
Figure 25:
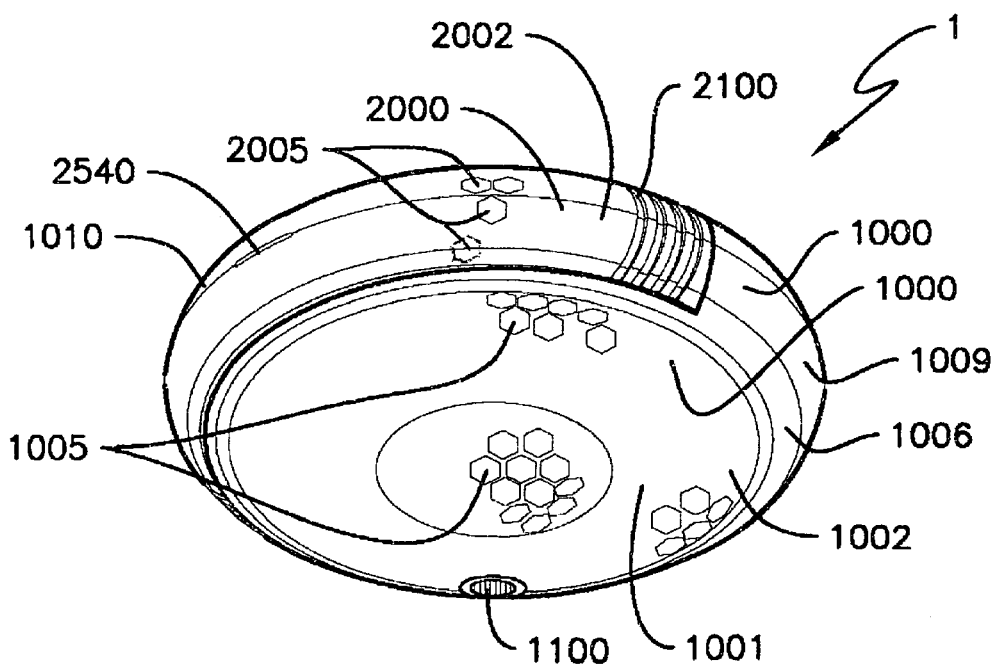
Figure 28:
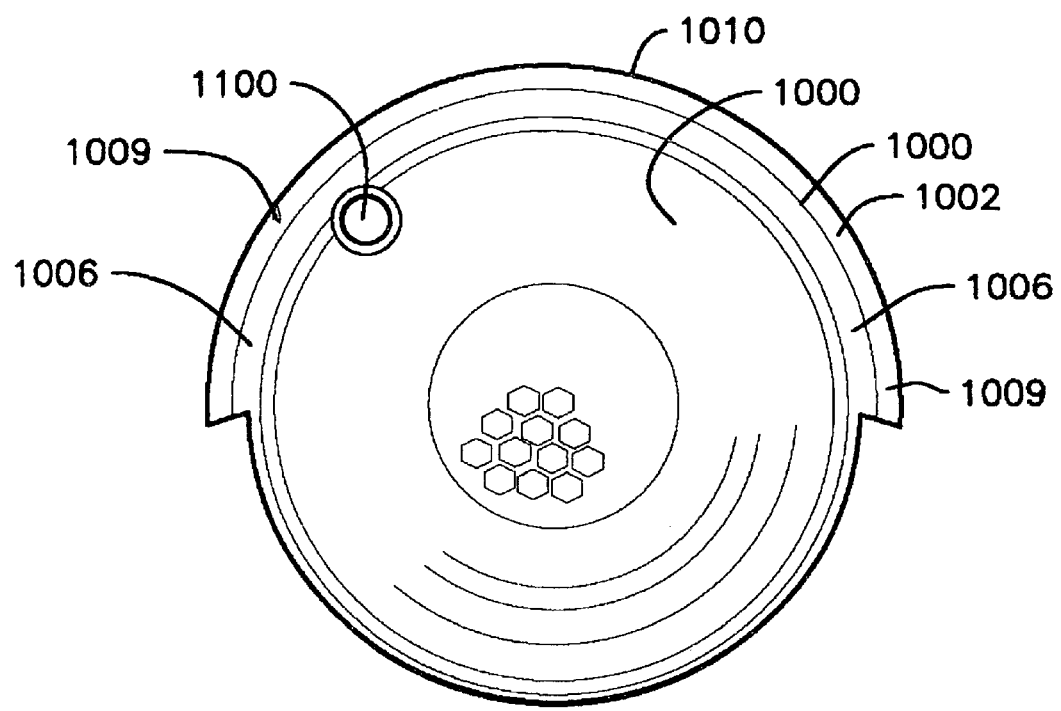
Figure 27:
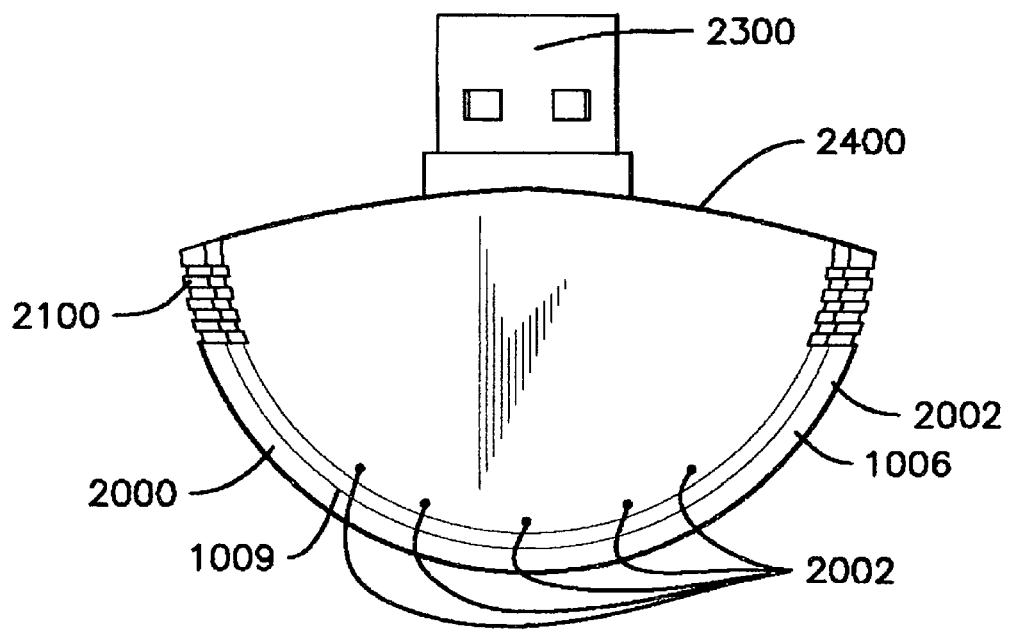
Figure 30:
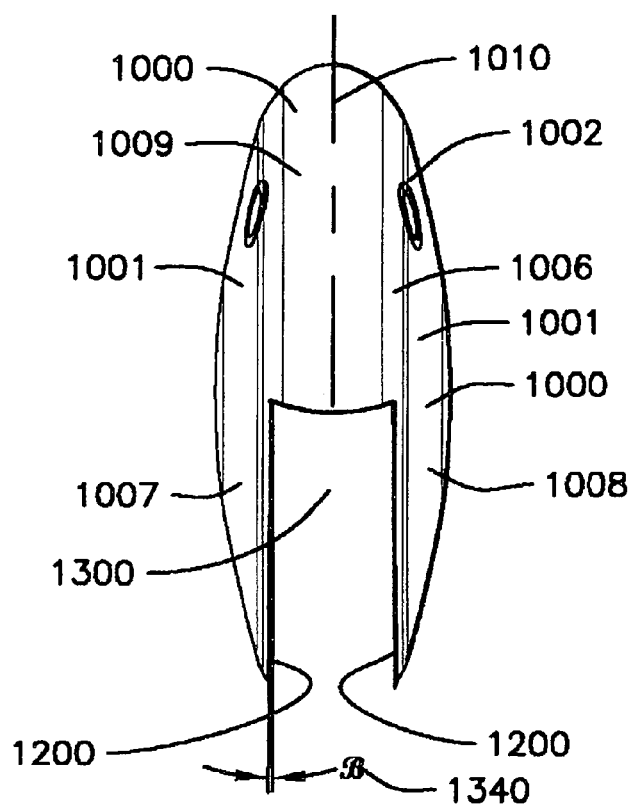
Figure 29:
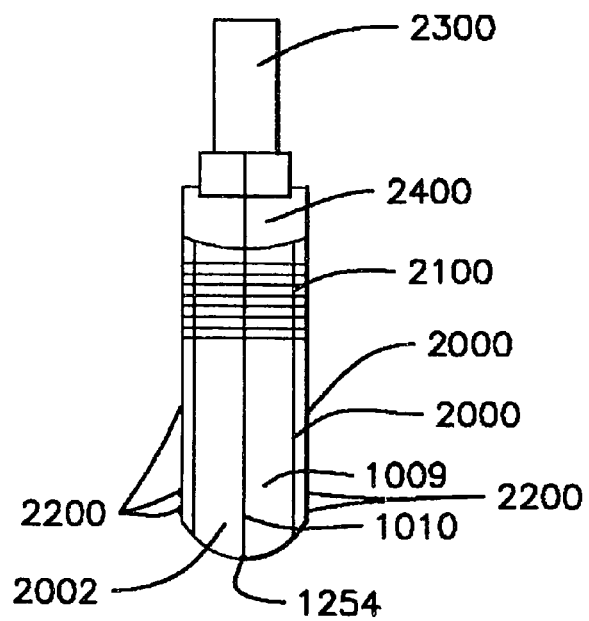
Figure 31:
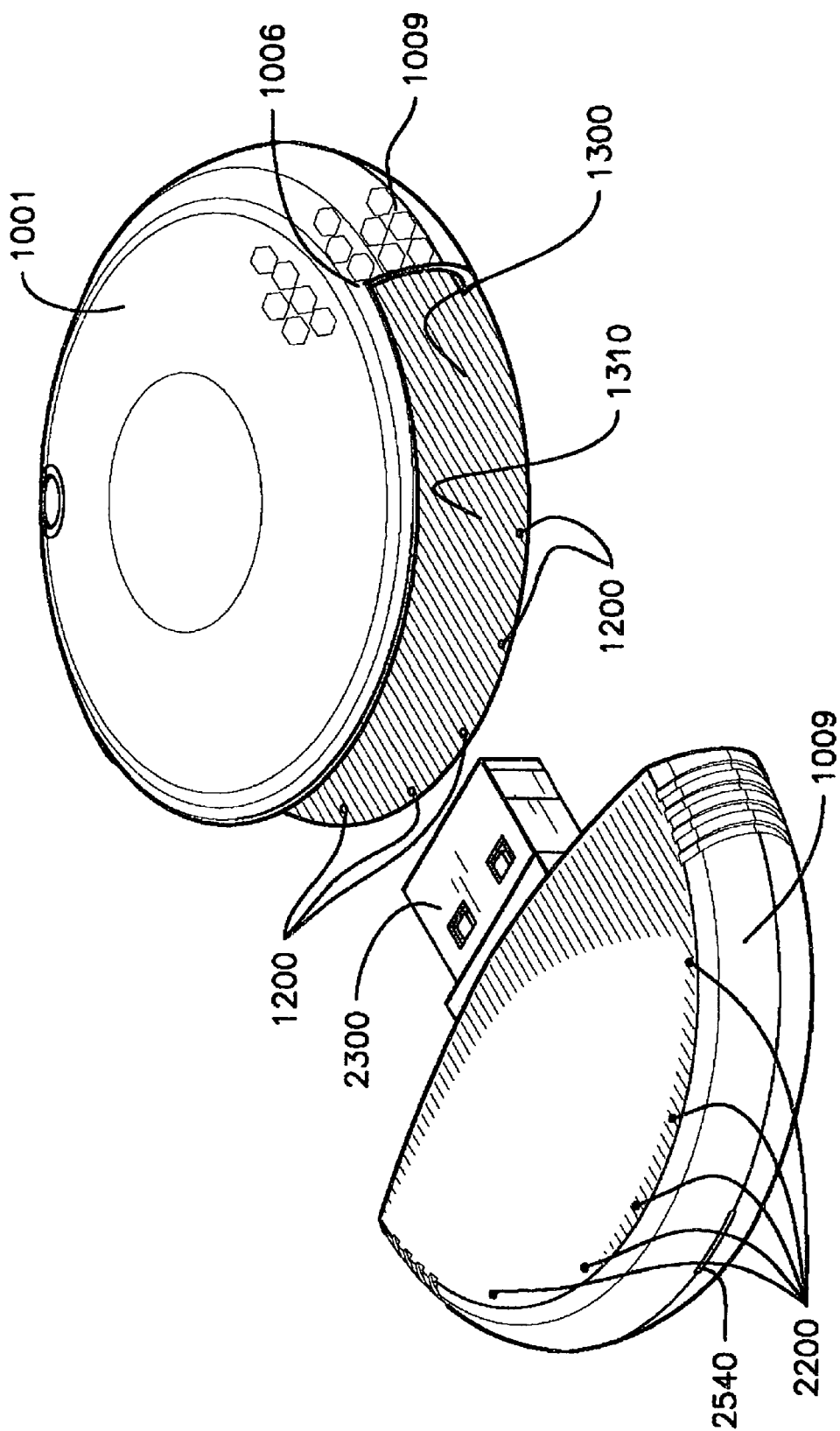
Figure 32:
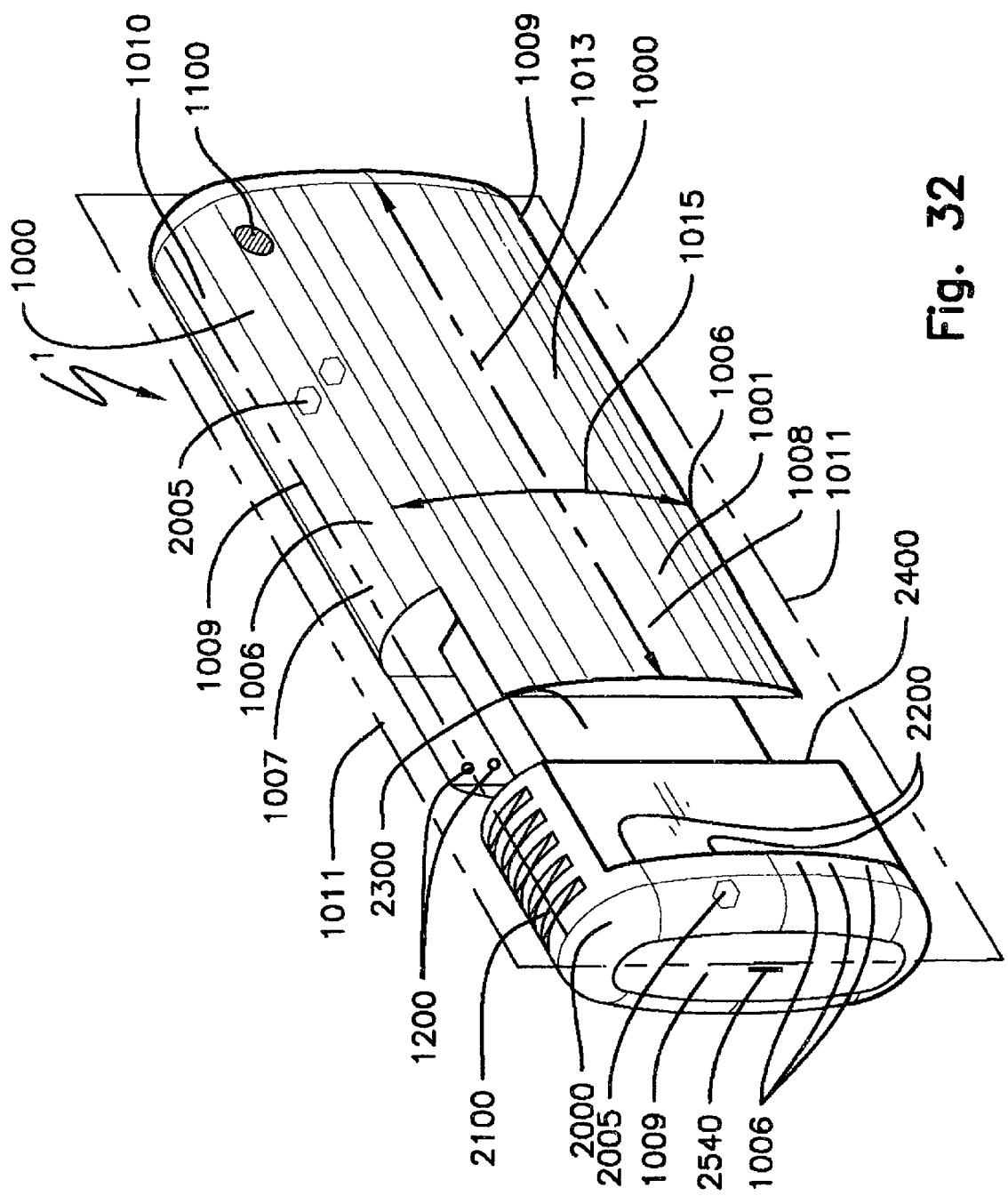
Figure 33:
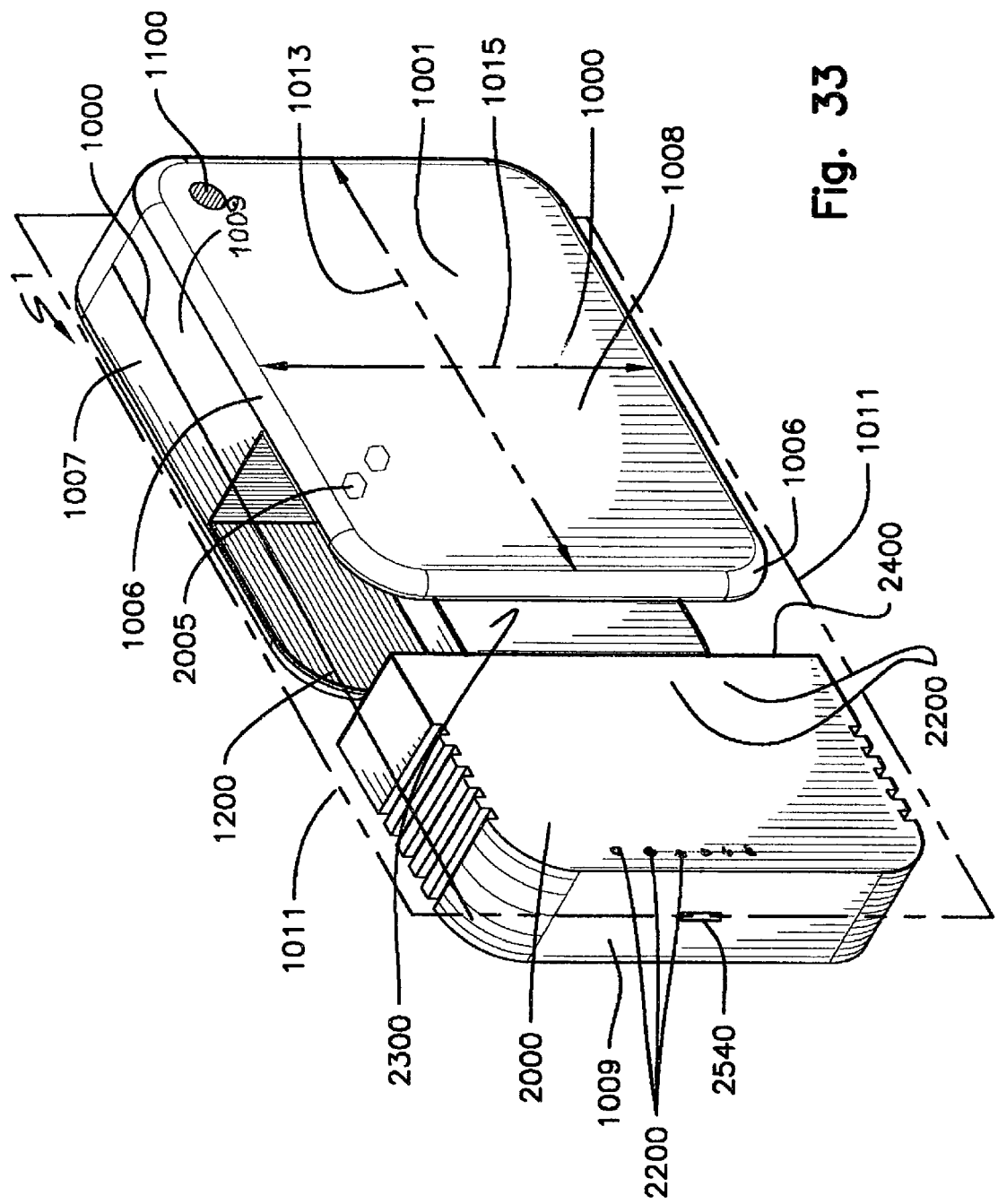

FIGS. 23 and 24 illustrate that at least one interior shell alignment post (2600) in either the interior shell first inside (2500) or the interior shell second inside (2510), is received into at least one interior shell alignment aperture (2610) in the opposing either interior shell first interior inside (2500) or the interior shell second inside (2510) thereby guiding the detent interconnection of the interior shell first interior side (2010) to the interior shell second interior side (2020).

FIGS. 5A, 7A, 7B, 14, 15, 16 and 18 shows that the first shell groove interface guide width D1 (1322) is greater than interface width D2 (2302). The shell groove interface support separation D5 (1335) is greater than the interface depth D3 (2303). The shell groove interface support width D4 (1336) is less than the interface width D2 (2302).

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. An interior and exterior shell containing a printed circuit board with extending connector apparatus (1) comprising:
   a. a shell (1) having an exterior shell (1000) with an imprint surface (1001), an exterior shell surface (1002) and an interior shell (2000) with an interior shell surface (2002); a shell radius transition (1006) from the imprint surface (1001) to the exterior shell surface (1002) and to the interior shell surface (2002); the shell radius transition (1006) forms a rounded surface between the imprint surface (1001) and the shell side (1009); the imprint surface (1001) has an imprint surface major diameter (1013) and an imprint surface minor diameter (1015) determining the area of the imprint surface (1001); the imprint surface (1001) is maximized by minimizing the area of the shell radius transition (1006) and shell side (1009);

b. the exterior shell surface (1002) having an exterior shell texture (1005); the interior shell (2000) having an interior shell texture (2002); the exterior shell texture (1005) and the interior shell texture (2002) may be smooth, dimpled and circular, elliptical or polygon shaped depressions or ridges;

c. the shell (1) having a shell circumference (1010); a shell plane (1011) extending through the shell circumference (1010) dividing the exterior shell (1000) into two generally mirror image halves and dividing the interior shell (2000) into two generally mirror image halves; the shell (1) may be generally spheroid, hexahedron or cuboid in shape and may have cross-sections which are circular, elliptical, oval, square and rectangular in cross-section and, where the shell (1) is generally spherical, may be formed into two generally mirror image hemispheres; the shell (1), where other than spheroidal in shape will have shell sides (1009) which are joined with the imprint surface (1001) by a shell radius (1006); the shell radius (1006) between the imprint surface (1001) and the shell sides (1009) forms a curvature or curved transition between the imprint surface (1001) and the shell sides (1009);

d. the exterior shell (1000) having an exterior shell groove (1300) bisected by the shell plane (1011); the exterior shell (1000) forming an exterior shell right half (1007) and an exterior shell left half (1008); the exterior shell groove (1300) extending into the exterior shell (1000) and away from the exterior shell surface (1002); the exterior shell groove (1300) equidistant from the exterior shell right half (1007) and the exterior shell left half (1008);

e. the exterior shell groove (1300) at the exterior shell right half (1007) having an having an exterior shell groove surface (1310); the exterior shell groove (1300) at the exterior shell left half (1008) having an having an exterior shell groove surface (1310); the exterior shell groove surface (1310) is planar; the exterior shell (1000), the exterior shell groove (1300), the exterior shell groove surface will generally be formed by a molding process comprised of generally rigid and semi-rigid materials including plastics;

f. at least one first shell groove interface guide (1320) within the exterior shell groove (1300) immovably affixed by first shell groove interface guide (1320) affixing means to and extending outwardly from an exterior shell interior surface (1003), at an exterior shell groove back (1004), toward the exterior shell surface (1002) and coincident with the exterior shell plane (1011); at least one second groove interface guide (1321) within the exterior shell groove (1300) immovably affixed by second groove interface guide (1321) affixing means to and extending outwardly from an exterior shell interior surface (1003), at the exterior shell groove back (1004), toward the exterior shell surface (1002) and coincident with the exterior shell plane (1011); the at least one first shell groove interface guide (1320) and the at least one second shell groove interface guide (1321) are generally orthogonal to the exterior shell plane (1011) and are planar;

g. the at least one first shell groove interface guide (1320) is distal from the at least one second shell groove interface guide (1321); the at least one first shell groove interface guide (1320) is separated from the at least one second shell groove interface guide (1321) by interface guide width D1 (1322); a groove interface guide mating surface (1330) is at each of the at least one first shell groove interface guide (1320) and the at least one second shell groove interface guide (1321) distal to the exterior shell groove back (1004);

h. at least one shell groove interface support (1332) extending outwardly from the exterior shell right half (1007) exterior shell groove surface (1310) toward the exterior shell left half (1008) and orthogonal to the exterior shell plane (1011); at least one shell groove interface support (1332) extending outwardly from the exterior shell left half (1008) exterior shell groove surface (1310) toward the exterior shell right half (1007) and orthogonal to the exterior shell plane (1011); each of the at least one shell groove interface support (1332) at the exterior shell right half (1007) exterior shell groove surface (1310) and at the exterior shell left half (1008) exterior shell groove surface (1310) extends from or proximal to the exterior shell interior surface (1003) at the exterior shell groove back (1004) away from the exterior shell interior surface (1003) and the exterior shell groove back (1004); at least two shell groove interface supports (1332) at the exterior shell right half (1007) exterior shell groove surface (1310) and at the exterior shell left half (1008) exterior shell groove surface (1310);

I. the at least one shell groove interface support (1332) extending outwardly from the exterior shell right half (1007) exterior shell groove surface (1310) separated by a shell groove interface support separation D5 (1335) from the at least one shell groove interface support (1332) extending outwardly from the exterior shell left half (1008) exterior shell groove surface (1310);

j. the exterior shell groove surface (1310) is at an exterior shell groove surface angle β (1340) to the exterior shell plane (1011); the exterior shell groove surface angle β (1340) is in the range of 0° and 5° and is preferred at 0.5°; the vertex of angle β (1340) is at or proximal to the exterior shell interior surface (1003) at the exterior shell groove back (1004);

k. a key chain aperture (1100) from the exterior shell right half (1007) to the exterior shell left half (1008);

l. at least one exterior shell detent (1200) within the exterior shell groove (1300) at the exterior shell groove surface (1310) at the exterior shell right half (1007) proximal the exterior shell surface (1002); the at least one exterior shell detent (1200) either an indentation or a protrusion;

m. the interior shell (2000) has an interior shell surface (2002) having an interior shell texture (2005), an interior shell first side (2010) and an interior shell second side (2020) and an interior shell interface aperture (2030); the interior shell interface aperture (2030) sized to securely receive an interface (2300);

n. at least one interior shell detent (2200) which is an indentation if the at least one exterior shell detent (1200) is a protrusion and which is a protrusion if the at least one exterior shell detent (1200) is an indentation; the at least one interior shell detent (2200) is aligned with and detent mates with the at least one exterior shell detent (1200) to create detent securing means when the interior shell (2000) is received into the exterior shell groove (1300);

o. the interface (2300) is a standard Printed Circuit Board and cable connection means including an USB connector; the interface (2300) has an interface width D2 (2302) and an interface depth D3 (2303); the interface (2300) is connected by electronic circuit connection means, including wiring, with a circuit board (2310) having at least one circuit (2320);

p. the interior shell (2000) has an interface guide mating surface (2400) which mirrors the shape of the groove interface guide mating surface (1330); the interface guide mating surface (2400) and the groove interface guide mating surface (1330) are in close proximity or touch when the interior shell (2000) is received into the exterior shell groove (1300);

r. the interior shell (2000) has an interior shell first interior side (2022) and an interior shell second interior side (2024); when the interior shell (2000) is received into the exterior shell groove (1300) the interior shell first interior side (2022) and the interior shell second interior side (2024) will be proximal to the exterior shell groove surface (1310) to one of either the exterior shell right half (1007) or the exterior shell left half (1008); an interior shell first interior side width D6 (2026), from the interior shell first interior side (2022) to the interior shell second interior side (2024) and proximal the interface (2300), is less than an interior shell second interior side width D7 (2028) from the interior shell first interior side (2022) to the interior shell second interior side (2024) and distal to the interface (2300); the interior shell first interior side (2022) and the interior shell second interior side (2024) are at an exterior shell groove surface angle β (1340) to the exterior shell plane (1011) when the interior shell (2000) is received into the exterior shell groove (1300); the exterior shell groove surface angle β (1340) is in the range of 0° and 5° and is preferred at 0.5°; the vertex of angle β (1340) is at or proximal to the interface (2300); the exterior shell groove surface angle β (1340) at the interior shell (2000) is equal to the exterior shell groove surface angle β (1340) at the exterior groove surface (1310); the exterior shell groove surface angle β (1340) engagement with the interior shell (2000) with the exterior shell groove surface (1310) as the interior shell (2000) is received and detent secured within the exterior shell groove (1300) exerts a friction security between the exterior shell (1000) and the interior shell (2000);

s. the interior shell first side (2010) has an interior shell first inside (2500); the interior shell second side (2020) has an interior shell second inside (2510); the interior shell first interior side (2010) is secured to the interior shell second side (2020) by at least one upstanding interior shell spring detent (2520), in either the interior shell first inside (2500) or the interior shell second inside (2510), received into at least one interior shell spring detent recess (2530), in the opposing either interior shell first interior inside (2500) or the interior shell second inside (2510), having an upstanding interior shell spring detent spring (2535); the interior shell spring detent (2520) exerts a protrusion or an indentation against the interior shell spring detent spring (2535) which by spring bias of the interior shell spring detent spring (2535) and detent interaction thereby securely affixing the interior shell first interior side (2010) to the interior shell second interior side (2020);

t. the at least one upstanding interior shell spring detent (2520) is released from the at least one interior shell spring detent recess (2530) by a twisting action asserted at a detent release slot (2540); the detent release slot (2540) is between the interior shell first inside (2500) and the interior shell second inside (2510) at and proximal the shell circumference (1010) at the interior shell (2000);

u. at least one interior shell alignment post (2600) in either the interior shell first inside (2500) or the interior shell second inside (2510), received into at least one interior shell alignment aperture (2610) in the opposing either interior shell first interior inside (2500) or the interior shell second inside (2510) thereby guiding the detent interconnection of the interior shell first interior side (2010) to the interior shell second interior side (2020);

v. the first shell groove interface guide width D1 (1322) is greater than interface width D2 (2302); the shell groove interface support separation D5 (1335) is greater than the interface depth D3 (2303); shell groove interface support width D4 (1336) is less than the interface width D2 (2302).

2. An interior and exterior shell containing a printed circuit board with extending connector apparatus (1) comprising:

a. a shell (1) having an exterior shell (1000), an exterior shell surface (1002) and an interior shell (2000) with an interior shell surface (2002);

b. the shell (1) having a shell circumference (1010);

c. the exterior shell (1000) having; the exterior shell (1000) forming an exterior shell right half (1007) and an exterior shell left half (1008);

d. the exterior shell groove (1300) at the exterior shell right half (1007) having an having an exterior shell groove surface (1310); the exterior shell groove (1300) at the exterior shell left half (1008) having an having an exterior shell groove surface (1310);

e. at least one first shell groove interface guide (1320) within the exterior shell groove (1300) immovably affixed by first shell groove interface guide (1320) affixing means to and extending outwardly from an exterior shell interior surface (1003), at an exterior shell groove back (1004), toward the exterior shell surface (1002); at least one second groove interface guide (1321) within the exterior shell groove (1300) immovably affixed by second groove interface guide (1321) affixing means to and extending outwardly from an exterior shell interior surface (1003), at the exterior shell groove back (1004), toward the exterior shell surface (1002);

f. a groove interface guide mating surface (1330) is at each of the at least one first shell groove interface guide (1320) and the at least one second shell groove interface guide (1321) distal to the exterior shell groove back (1004);

g. at least one shell groove interface support (1332) extending outwardly from the exterior shell right half (1007) exterior shell groove surface (1310) toward the exterior shell left half (1008); at least one shell groove interface support (1332) extending outwardly from the exterior shell left half (1008) exterior shell groove surface (1310) toward the exterior shell right half (1007);

h. the at least one shell groove interface support (1332) extending outwardly from the exterior shell right half (1007) exterior shell groove surface (1310) separated by a shell groove interface support separation D5 (1335) from the at least one shell groove interface support (1332) extending outwardly from the exterior shell left half (1008) exterior shell groove surface (1310);

I. the exterior shell groove surface (1310) is at an exterior shell groove surface angle β (1340) to the exterior shell plane (1011); the vertex of angle β (1340) is at or proximal to the exterior shell interior surface (1003) at the exterior shell groove back (1004);

j. at least one exterior shell detent (1200) within the exterior shell groove (1300) at the exterior shell right half (1007) proximal the exterior shell surface (1002);

k. the exterior shell surface (1002) having an exterior shell texture (1005); the interior shell (2000) has an interior shell surface (2002) having an interior shell texture (2005), an interior shell first side (2010) and an interior shell second side (2020) and an interior shell interface aperture (2030); the interior shell interface aperture (2030) sized to securely receive an interface (2300);

l. at least one interior shell detent (2200); the at least one interior shell detent (2200) is aligned with and detent mates with the at least one exterior shell detent (1200) to create detent securing means when the interior shell (2000) is received into the exterior shell groove (1300);

n. the interface (2300) is a standard Printed Circuit Board and cable connection means including an USB connector; the interface (2300) has an interface width D2 (2302) and an interface depth D3 (2303); the interface (2300) is connected by electronic circuit connection means, including wiring, with a circuit board (2310) having at least one circuit (2320) including a memory storage circuit (2320);

o. the interior shell (2000) has an interface guide mating surface (2400);

p. the interior shell (2000) has an interior shell first interior side (2022) and an interior shell second interior side (2024); when the interior shell (2000) is received into the exterior shell groove (1300) the interior shell first interior side (2022) and the interior shell second interior side (2024) will be proximal to the exterior shell groove surface (1310) to one of either the exterior shell right half (1007) or the exterior shell left half (1008);

q. the interior shell first side (2010) has an interior shell first inside (2500); the interior shell second side (2020) has an interior shell second inside (2510); the interior shell first interior side (2010) is secured to the interior shell second side (2020) by securing means including detent (2520) means;

r. at least one interior shell alignment post (2600) in either the interior shell first inside (2500) or the interior shell second inside (2510), received into at least one interior shell alignment aperture (2610) in the opposing either interior shell first interior inside (2500) or the interior shell second inside (2510) thereby guiding the detent interconnection of the interior shell first interior side (2010) to the interior shell second interior side (2020).

3. An interior and exterior shell containing a printed circuit board with extending connector apparatus (1) from claim 2 further comprising:

a. an imprint surface (1001) at the exterior shell surface (1002); the exterior shell surface (1002) having an exterior shell texture (1005); the interior shell (2000) having an interior shell texture (2002); a shell plane (1011) extending through the shell circumference (1010) dividing the exterior shell (1000) into two generally mirror image halves and dividing the interior shell (2000) into two generally mirror image halves; the exterior shell groove (1300) bisected by the shell plane (1011);

b. the shell (1) may be generally spheroid, hexahedron or cuboid in shape and may have cross-sections which are circular, elliptical, oval, square and rectangular in cross-section;

c. the exterior shell groove (1300) extending into the exterior shell (1000) and away from the exterior shell surface (1002); the exterior shell groove (1300) equidistant from the exterior shell right half (1007) and the exterior shell left half (1008); the exterior shell groove surface (1310) is planar;

d. at least two shell groove interface supports (1332) at the exterior shell right half (1007) exterior shell groove surface (1310) and at the exterior shell left half (1008) exterior shell groove surface (1310); the at least one first shell groove interface guide (1320) is coincident with the exterior shell plane (1011); the at least one second groove interface guide (1321) is coincident with the exterior shell plane (1011); the at least one first shell groove interface guide (1320) and the at least one second shell groove interface guide (1321) are generally orthogonal to the exterior shell plane (1011) and are planar; the at least one first shell groove interface guide (1320) is distal from the at least one second shell groove interface guide (1321); the at least one first shell groove interface guide (1320) is separated from the at least one second shell groove interface guide (1321) by interface guide width D1 (1322);

e. the at least one shell groove interface support (1332) extending orthogonal to the exterior shell plane (1011); the at least one shell groove interface support (1332) extending orthogonal to the exterior shell plane (1011); each of the at least one shell groove interface support (1332) at the exterior shell right half (1007) exterior shell groove surface (1310) and at the exterior shell left half (1008) exterior shell groove surface (1310) extends from or proximal to the exterior shell interior surface (1003) at the exterior shell groove back (1004) away from the exterior shell interior surface (1003) and the exterior shell groove back (1004);

f. the exterior shell groove surface angle β (1340) is in the range of 0° and 5°;

g. at least one finger grip (2100) at the interior shell surface (2002) coincident with the circumference (1010);

h. the at least one circuit (2320) including a memory storage circuit (2320);

I. the interface guide mating surface (2400) is generally convex and mirrors the shape of the groove interface guide mating surface (1330), being generally concave; the interface guide mating surface (2400) and the groove interface guide mating surface (1330) are in close proximity or touch when the interior shell (2000) is received into the exterior shell groove (1300);

j. an interior shell first interior side width D6 (2026), from the interior shell first interior side (2022) to the interior shell second interior side (2024) and proximal the interface (2300), is less than an interior shell second interior side width D7 (2028) from the interior shell first interior side (2022) to the interior shell second interior side (2024) and distal to the interface (2300); the interior shell first interior side (2022) and the interior shell second interior side (2024) are at an exterior shell groove surface angle β (1340) to the exterior shell plane (1011) when the interior shell (2000) is received into the exterior shell groove (1300); the vertex of angle β (1340) is at or proximal to the interface (2300); the exterior shell groove surface angle β (1340) at the interior shell (2000) is equal to the exterior shell groove surface angle β (1340) at the exterior groove surface (1310);

k. the interior shell first side (2010) detent (2520) means composed of at least one upstanding interior shell spring detent (2520), in either the interior shell first inside (2500) or the interior shell second inside (2510), received into at least one interior shell spring detent recess (2530), in the opposing either interior shell first interior inside (2500) or the interior shell second inside (2510);
l. the at least one interior shell alignment post (2600) is generally cylindrical and is received into a like shaped cylindrical shaped at least one interior shell alignment aperture (2610);
m. the first shell groove interface guide width D1 (1322) is greater than interface width D2 (2302); the shell groove interface support separation D5 (1335) is greater than the interface depth D3 (2303); shell groove interface support width D4 (1336) is less than the interface width D2 (2302).

4. An interior and exterior shell containing a printed circuit board with extending connector apparatus (1) from claim 3 further comprising:
   a. the exterior shell texture (1005) and the interior shell texture (2002) may be smooth or dimpled in pattern where the dimpled pattern comprises repeated or irregular circular, elliptical or polygon shaped depressions or ridges; the exterior shell texture (1005) and the interior shell texture (2002), where dimpled or having a pattern, will overlap between exterior shell (1000) and the interior shell (2000) thus obscuring the existence of the interior shell (2000) when received into the exterior shell (1000);
   b. the shell (1) when generally spherical, may be formed into two generally mirror image hemispheres; the shell (1), where other than spheroidal in shape will have shell sides (1009) which are joined with the imprint surface (1001) by a shell radius (1006);
   c. the exterior shell (1000), the exterior shell groove (1300), the exterior shell groove surface (1310) will generally be formed by a molding process comprised of generally rigid and semi-rigid materials including plastics, metals, composite materials including carbon fiber materials;
   d. the interior shell (2000) will generally be formed by a molding process comprised of generally rigid and semi-rigid materials including plastics, metals, composite materials including carbon fiber materials;
   e. the exterior shell groove surface angle β (1340) is 0.5°;
   f. the at least one finger grip (2100) composed of alternating groves and ridges;
   g. the at least one exterior shell detent (1200) either an indentation or a protrusion; the at least one interior shell detent (2200) is an indentation if the at least one exterior shell detent (1200) is a protrusion and is a protrusion if the at least one exterior shell detent (1200) is an indentation; the at least one exterior shell detent (1200) and the at least one interior shell detent (2200) comprised of at least five detents;
   h. the at least one interior shell spring detent recess (2530) having an upstanding interior shell spring detent spring (2535); the interior shell spring detent (2520) presents a protrusion or an indentation against the interior shell spring detent spring (2535) which by spring bias of the interior shell spring detent spring (2535) and detent interaction thereby securely affixing the interior shell first interior side (2010) to the interior shell second interior side (2020);
   I. the at least one upstanding interior shell spring detent (2520) is released from the at least one interior shell spring detent recess (2530) and interior shell spring detent spring (2535) by a twisting action asserted at a detent release slot (2540); the detent release slot (2540) is between the interior shell first inside (2500) and the interior shell second inside (2510) at and proximal the shell circumference (1010) at the interior shell (2000).

5. An interior and exterior shell containing a printed circuit board with extending connector apparatus (1) from claim 4 further comprising:
   a. the shell radius (1006) between the imprint surface (1001) and the shell sides (1009) forms a curvature or curved transition between the imprint surface (1001) and the shell sides (1009);
   b. at least two finger grips (2100) at the interior shell surface (2002) each distal from the other;
   c. the exterior shell texture (1005) and the interior shell texture (2002) may have the dimpled appearance of a golf ball;
   d. the exterior shell groove surface angle β (1340) engagement with the interior shell (2000) with the exterior shell groove surface (1310) as the interior shell (2000) is received and detent secured within the exterior shell groove (1300) exerts a friction security between the exterior shell (1000) and the interior shell (2000);
   e. a key chain aperture (1100) from the exterior shell right half (1007) to the exterior shell left half (1008);
   f. at least one finger grip (2100) at the interior shell surface (2002) where the at least one finger grip (2100) comprises alternating groves and ridges; at least two finger grips (2100) at the interior shell surface (2002) each distal from the other;
   g. the imprint surface (1001) has an imprint surface major diameter (1013) and an imprint surface minor diameter (1015) determining the area of the imprint surface (1001); the imprint surface (1001) is maximized by minimizing the area of the shell radius transition (1006) and shell side (1009).

\* \* \* \* \*